(12) United States Patent
Shirakawa et al.

(10) Patent No.: US 11,615,850 B2
(45) Date of Patent: Mar. 28, 2023

(54) SEMICONDUCTOR MEMORY DEVICE

(71) Applicant: Kioxia Corporation, Tokyo (JP)

(72) Inventors: Masanobu Shirakawa, Chigasaki (JP); Takuya Futatsuyama, Yokohama (JP)

(73) Assignee: Kioxia Corporation, Tokyo (JP)

( * ) Notice: Subject to any disclaimer, the term of this patent is extended or adjusted under 35 U.S.C. 154(b) by 0 days.

(21) Appl. No.: 17/548,664

(22) Filed: Dec. 13, 2021

(65) Prior Publication Data

US 2022/0101924 A1 Mar. 31, 2022

Related U.S. Application Data

(63) Continuation of application No. 17/244,306, filed on Apr. 29, 2021, now Pat. No. 11,238,938, which is a (Continued)

(30) Foreign Application Priority Data

Sep. 20, 2018 (JP) .............................. JP2018-175787

(51) Int. Cl.
*G11C 16/10* (2006.01)
*G11C 16/04* (2006.01)
(Continued)

(52) U.S. Cl.
CPC .......... *G11C 16/10* (2013.01); *G11C 11/5671* (2013.01); *G11C 16/0483* (2013.01); *G11C 16/3459* (2013.01); *H01L 27/1157* (2013.01); *H01L 27/11565* (2013.01); *H01L 27/11582* (2013.01)

(58) Field of Classification Search
CPC . G11C 16/10; G11C 11/5671; G11C 16/0483; G11C 16/3459; G11C 16/345; H01L 27/11565; H01L 27/1157; H01L 27/11582; H01L 27/11519; H01L 27/11556
See application file for complete search history.

(56) References Cited

U.S. PATENT DOCUMENTS 8,250,437 B2 8/2012 Sakurada et al.
8,854,896 B2 10/2014 Hosono et al.
(Continued)

FOREIGN PATENT DOCUMENTS

JP 2014-75169 4/2014
JP 2017-168158 9/2017

*Primary Examiner* — Xiaochun L Chen
(74) *Attorney, Agent, or Firm* — Oblon, McClelland, Maier & Neustadt, L.L.P.

(57) ABSTRACT

According to one embodiment, a semiconductor memory device includes: a first memory cell; a second memory cell; a first word line; a second word line; and a first bit line. The device is configured to execute a first operation, a second operation, and a third operation to write data into the first memory cell. In the first operation, a first voltage is applied to the second word line. In the second operation, after the first operation, a second voltage higher than the first voltage is applied to the second word line. In the third operation, after the second operation, a third voltage higher than the second voltage is applied to the first word line, and a fourth voltage lower than both the second voltage and the third voltage is applied to the second word line.

20 Claims, 38 Drawing Sheets

Related U.S. Application Data continuation of application No. 16/852,733, filed on Apr. 20, 2020, now Pat. No. 11,024,386, which is a continuation of application No. 16/298,135, filed on Mar. 11, 2019, now Pat. No. 10,672,478.

(51) Int. Cl.
  *G11C 11/56*     (2006.01)
  *G11C 16/34*     (2006.01)
  *H01L 27/11582*  (2017.01)
  *H01L 27/11565*  (2017.01)
  *H01L 27/1157*   (2017.01)

(56) References Cited

U.S. PATENT DOCUMENTS

| | | |
|---|---|---|
| 9,196,365 B2 | 11/2015 | Park |
| 9,424,935 B2 | 8/2016 | Shim |
| 9,767,910 B1 | 9/2017 | Bushnaq et al. |
| 9,916,900 B2 | 3/2018 | Kim et al. |
| 2015/0179266 A1 | 6/2015 | Park |
| 2015/0370705 A1 | 12/2015 | Yoon |
| 2017/0062059 A1* | 3/2017 | Kim ..................... G11C 16/14 |
| 2018/0204621 A1 | 7/2018 | Kim et al. |

* cited by examiner

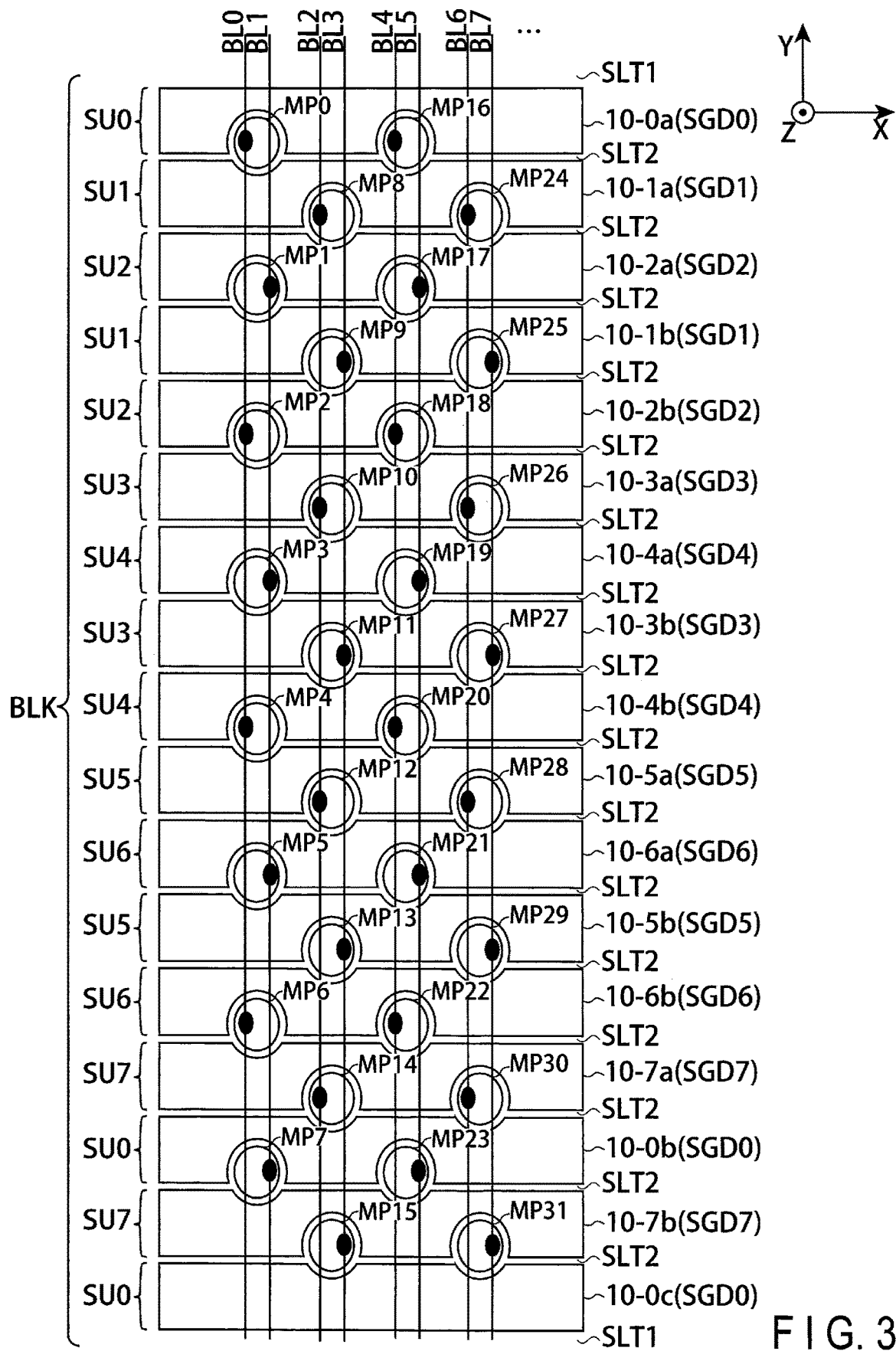
F I G. 3

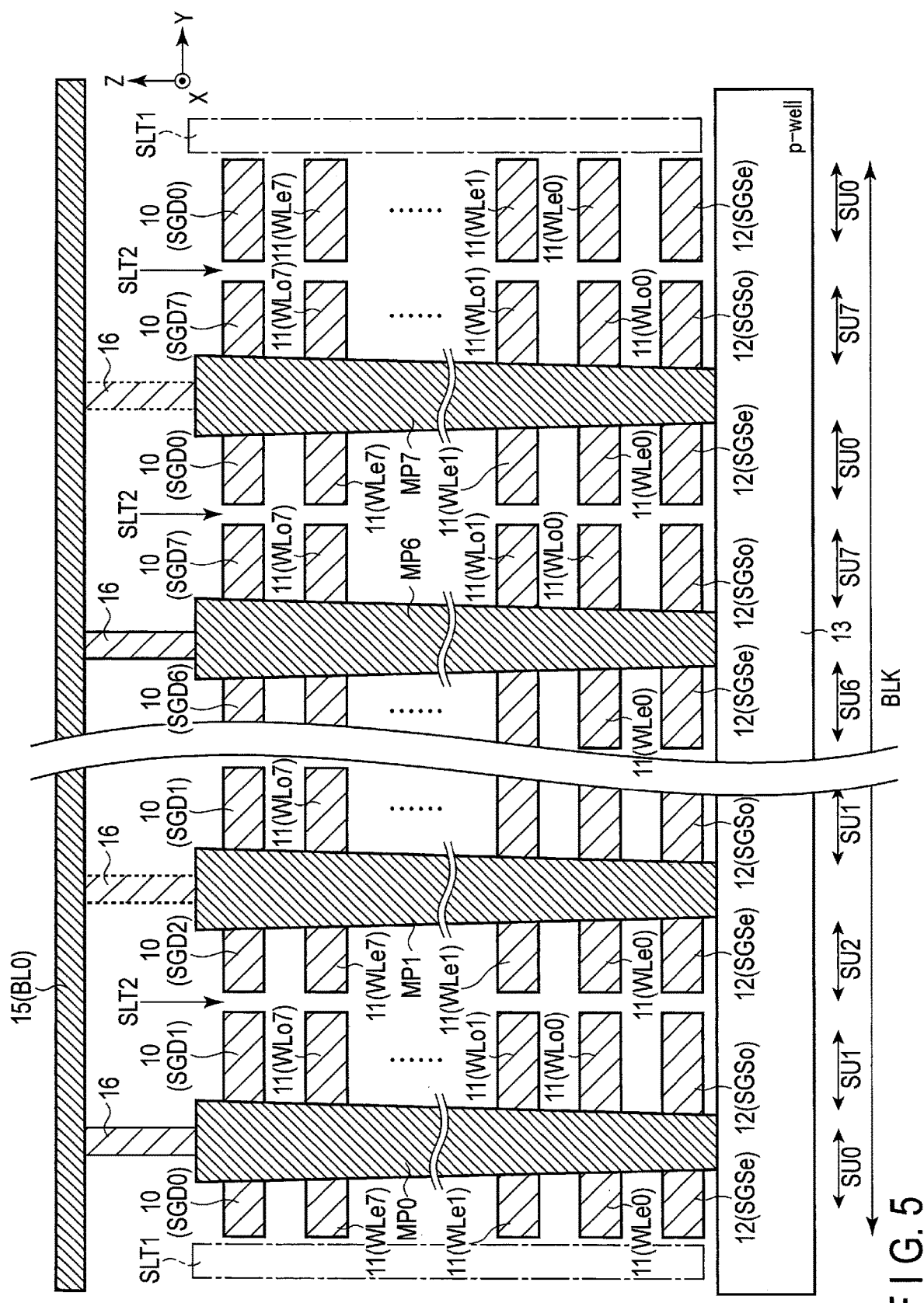
F I G. 5

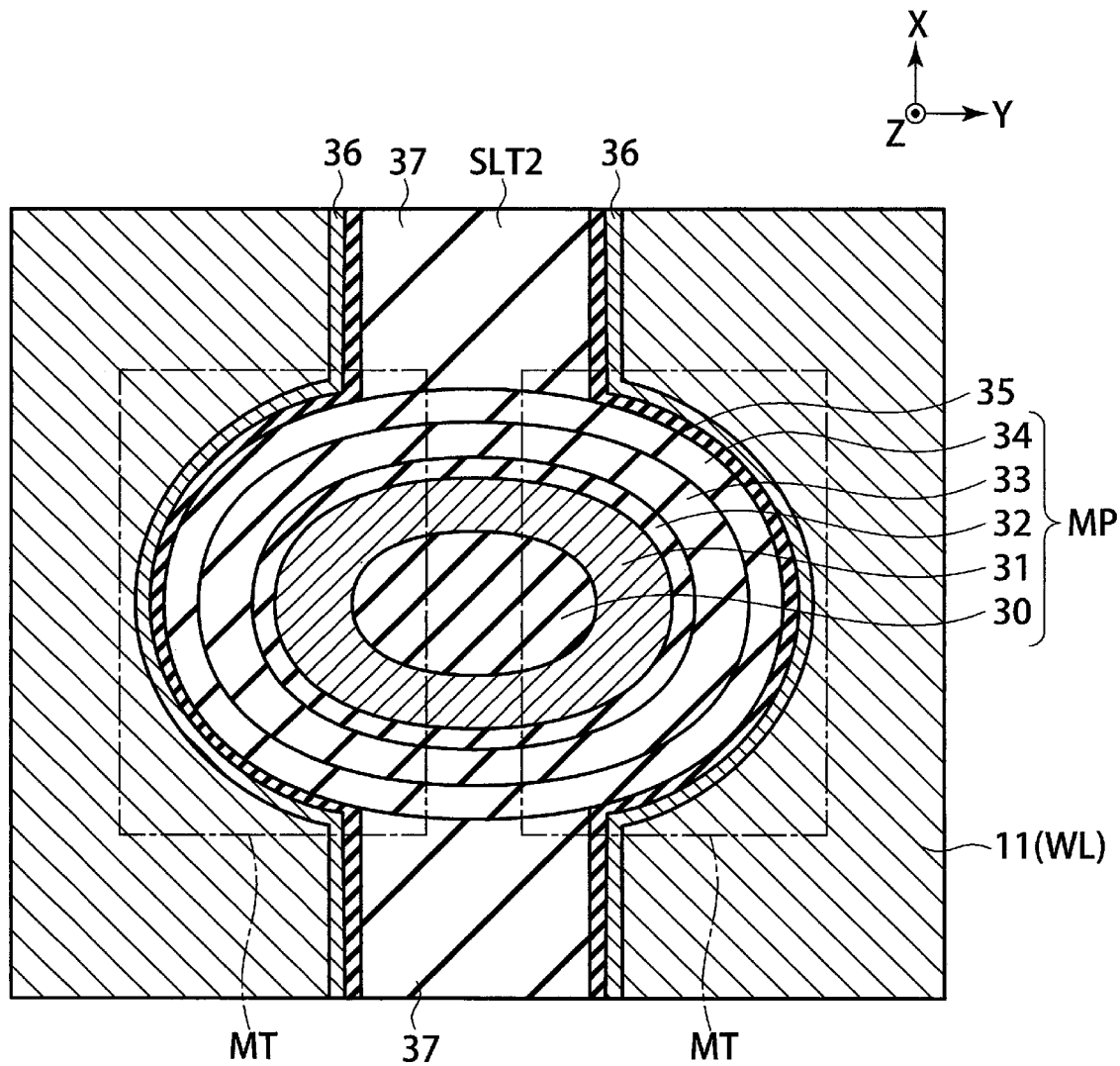
F I G. 6

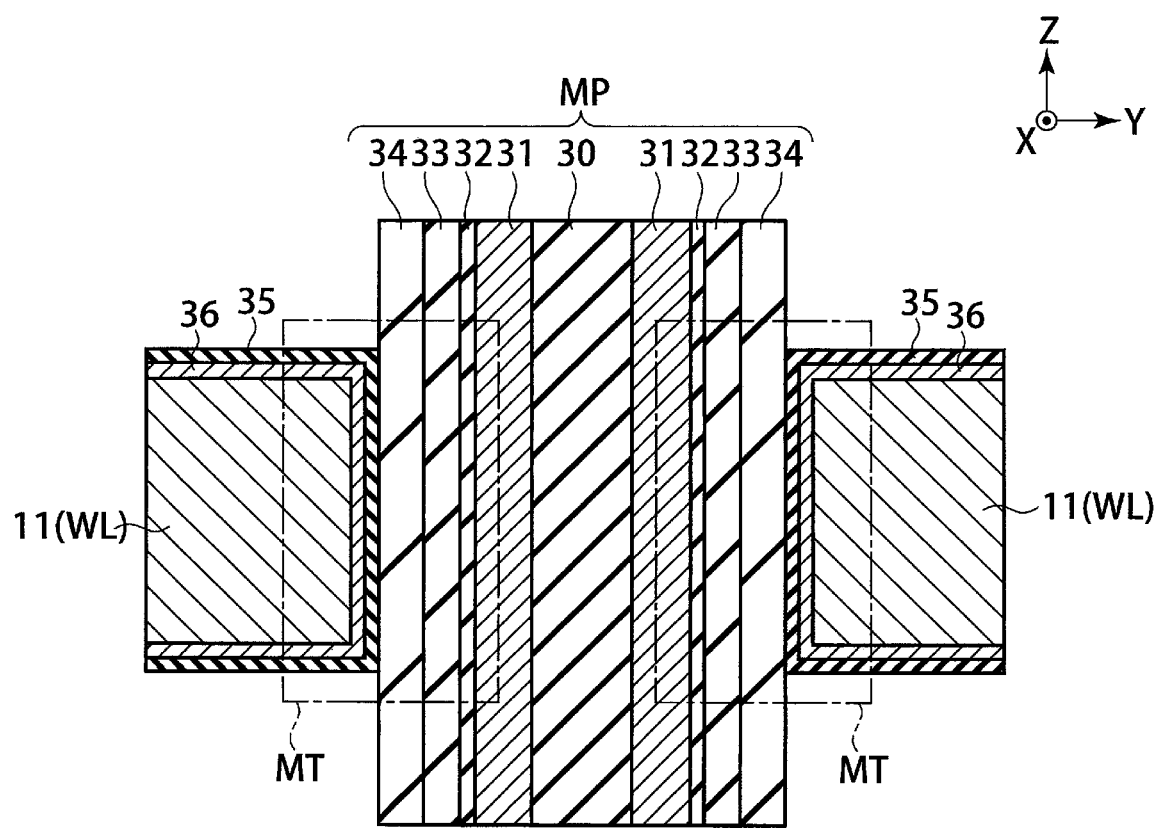
F I G. 7

F I G. 10

| Write target SU | Pre-verify target SU | Pre-program target SU |
|---|---|---|
| SU0 | SU0<br>SU1※1<br>SU7※2 | SU0<br>SU1<br>SU7 |
| SU1 | SU1<br>SU2※2 | SU1<br>SU2 |
| SU2 | SU2<br>SU3※1 | SU2<br>SU3 |
| SU3 | SU3<br>SU4※2 | SU3<br>SU4 |
| SU4 | SU4<br>SU5※1 | SU4<br>SU5 |
| SU5 | SU5<br>SU6※2 | SU5<br>SU6 |
| SU6 | SU6<br>SU7※1 | SU6<br>SU7 |
| SU7 | SU7 | SU7 |

※1: BL(4j)
※2: BL(4j+1), BL(4j+2), BL(4j+3)

F I G. 13

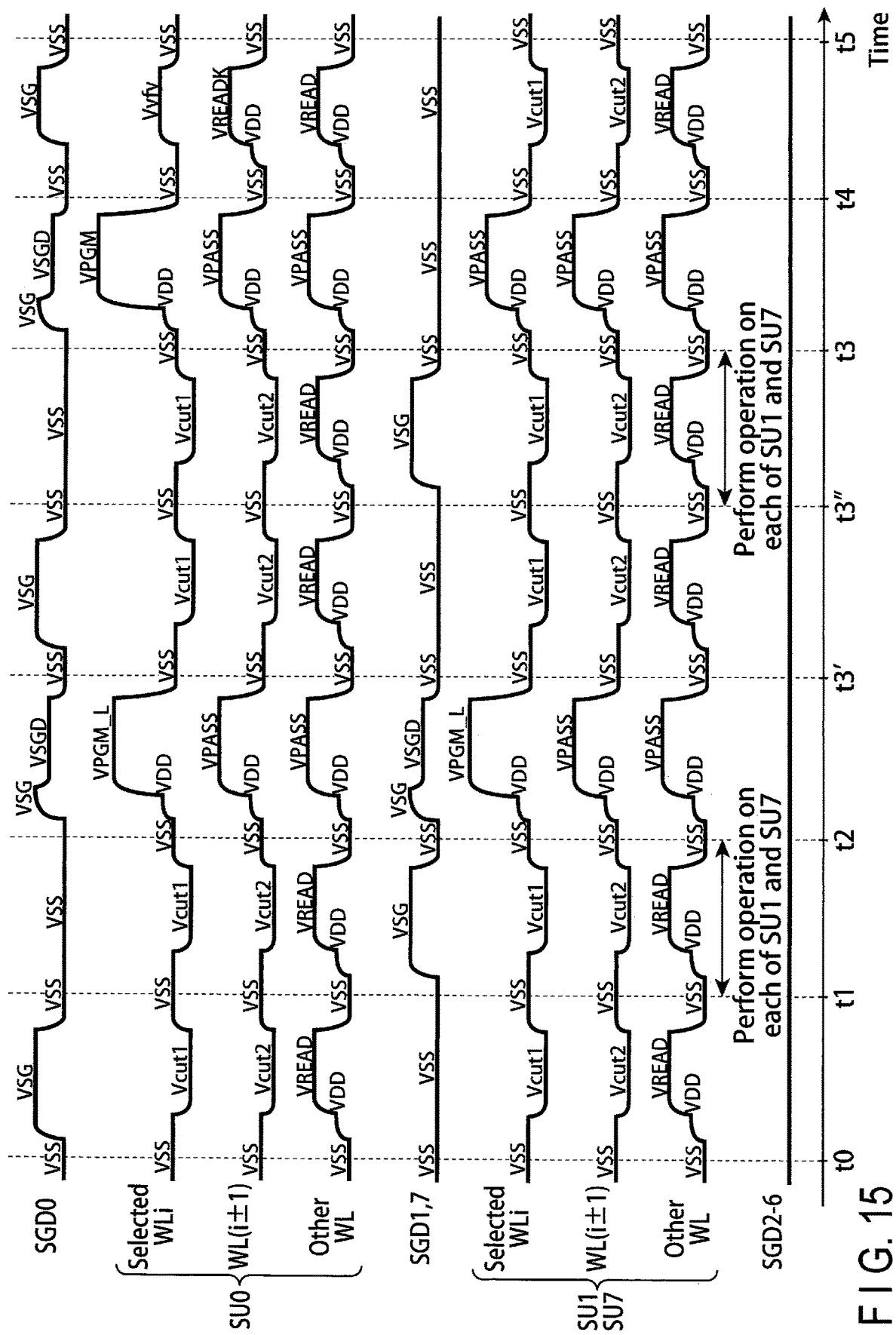
F I G. 15

F I G. 18

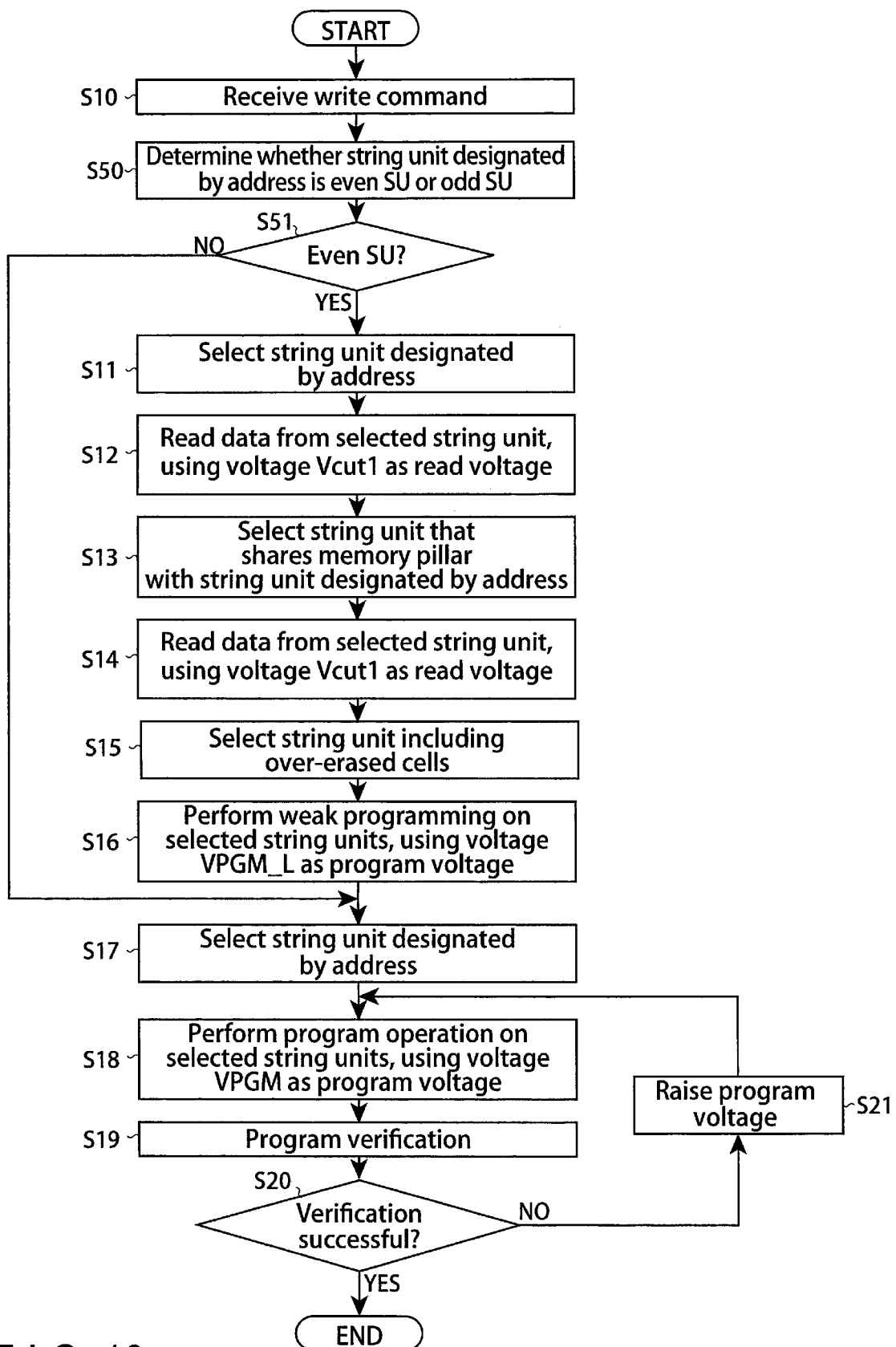
F I G. 19

| Write target SU | Pre-verify target SU | Pre-program target SU |
|---|---|---|
| SU0 | SU0<br>SU1※1<br>SU7※2 | SU0<br>SU1<br>SU7 |
| SU1 | | |
| SU2 | SU1※2<br>SU2<br>SU3※1 | SU1<br>SU2<br>SU3 |
| SU3 | | |
| SU4 | SU3※2<br>SU4<br>SU5※1 | SU3<br>SU4<br>SU5 |
| SU5 | | |
| SU6 | SU5※2<br>SU6<br>SU7※1 | SU5<br>SU6<br>SU7 |
| SU7 | | |

F I G. 20

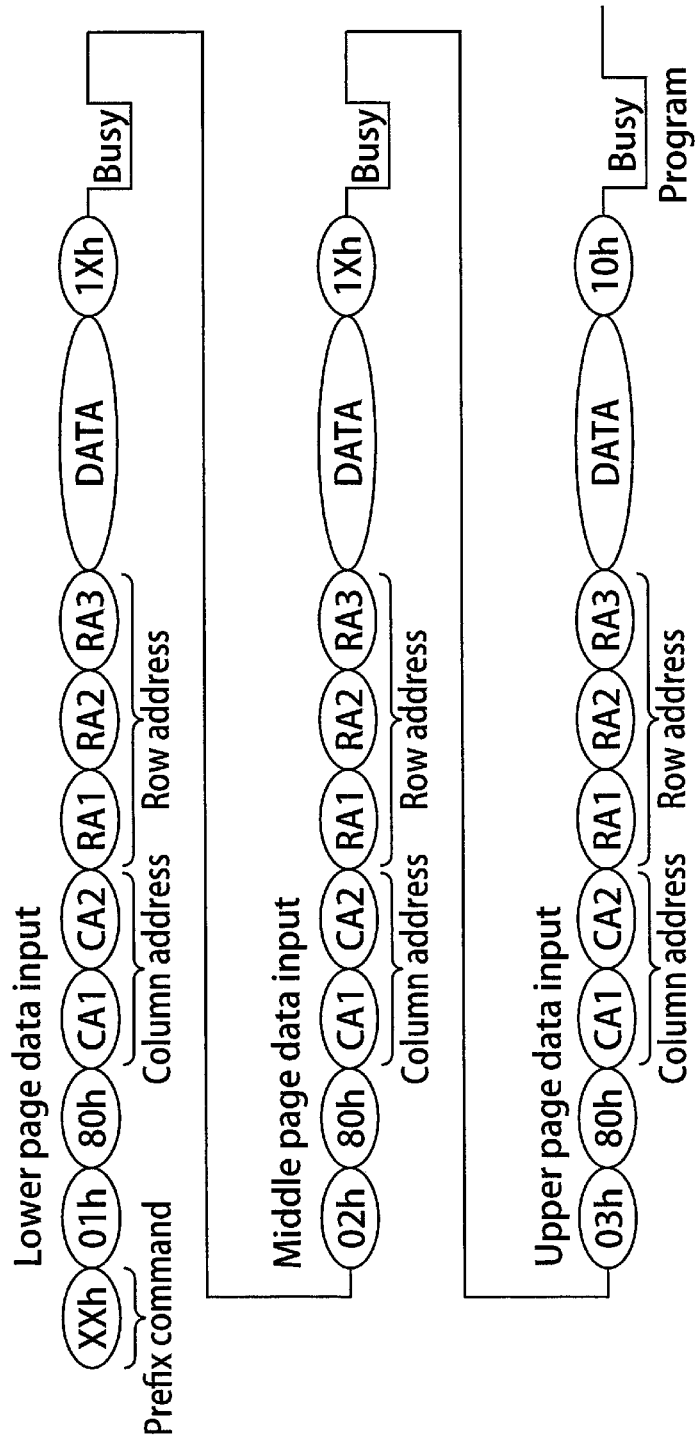
F I G. 21

F I G. 22

| | SU0 | | SU1 | | SU2 | | SU3 | | SU4 | | SU5 | | SU6 | | SU7 | |
|---|---|---|---|---|---|---|---|---|---|---|---|---|---|---|---|---|
| | 1st | 2nd | 1st | 2nd | 1st | 2nd | 1st | 2nd | 1st | 2nd | 1st | 2nd | 1st | 2nd | 1st | 2nd |
| WL7 | 104 | 120 | 105 | 121 | 106 | 122 | 107 | 123 | 108 | 124 | 109 | 125 | 110 | 126 | 111 | 127 |
| WL6 | 88 | 112 | 89 | 113 | 90 | 114 | 91 | 115 | 92 | 116 | 93 | 117 | 94 | 118 | 95 | 119 |
| WL5 | 72 | 96 | 73 | 97 | 74 | 98 | 75 | 99 | 76 | 100 | 77 | 101 | 78 | 102 | 79 | 103 |
| WL4 | 56 | 80 | 57 | 81 | 58 | 82 | 59 | 83 | 60 | 84 | 61 | 85 | 62 | 86 | 63 | 87 |
| WL3 | 40 | 64 | 41 | 65 | 42 | 66 | 43 | 67 | 44 | 68 | 45 | 69 | 46 | 70 | 47 | 71 |
| WL2 | 24 | 48 | 25 | 49 | 26 | 50 | 27 | 51 | 28 | 52 | 29 | 53 | 30 | 54 | 31 | 55 |
| WL1 | 8 | 32 | 9 | 33 | 10 | 34 | 11 | 35 | 12 | 36 | 13 | 37 | 14 | 38 | 15 | 39 |
| WL0 | 0 | 16 | 1 | 17 | 2 | 18 | 3 | 19 | 4 | 20 | 5 | 21 | 6 | 22 | 7 | 23 |

FIG. 25

| Write target SU | Pre-verify target SU | | Pre-program target SU | |
|---|---|---|---|---|
| | 1st stage | 2nd stage | 1st stage | 2nd stage |
| SU0 | SU0<br>SU1※1<br>SU7※2 | | SU0<br>SU1<br>SU7 | |
| SU1 | SU1<br>SU2※2 | | SU1<br>SU2 | |
| SU2 | SU2<br>SU3※1 | | SU2<br>SU3 | |
| SU3 | SU3<br>SU4※2 | | SU3<br>SU4 | |
| SU4 | SU4<br>SU5※1 | | SU4<br>SU5 | |
| SU5 | SU5<br>SU6※2 | | SU5<br>SU6 | |
| SU6 | SU6<br>SU7※1 | | SU6<br>SU7 | |
| SU7 | SU7 | | SU7 | |

F I G. 27

|  | SU0 | | SU1 | | SU2 | | SU3 | | SU4 | | SU5 | | SU6 | | SU7 | |
|---|---|---|---|---|---|---|---|---|---|---|---|---|---|---|---|---|
|  | 1st | 2nd | 1st | 2nd | 1st | 2nd | 1st | 2nd | 1st | 2nd | 1st | 2nd | 1st | 2nd | 1st | 2nd |
| WL7 | 104 | 120 | 108 | 124 | 105 | 121 | 109 | 125 | 106 | 122 | 110 | 126 | 107 | 123 | 111 | 127 |
| WL6 | 88 | 112 | 92 | 116 | 89 | 113 | 93 | 117 | 90 | 114 | 94 | 118 | 91 | 115 | 95 | 119 |
| WL5 | 72 | 96 | 76 | 100 | 73 | 97 | 77 | 101 | 74 | 98 | 78 | 102 | 75 | 99 | 79 | 103 |
| WL4 | 56 | 80 | 60 | 84 | 57 | 81 | 61 | 85 | 58 | 82 | 62 | 86 | 59 | 83 | 63 | 87 |
| WL3 | 40 | 64 | 44 | 68 | 41 | 65 | 45 | 69 | 42 | 66 | 46 | 70 | 43 | 67 | 47 | 71 |
| WL2 | 24 | 48 | 28 | 52 | 25 | 49 | 29 | 53 | 26 | 50 | 30 | 54 | 27 | 51 | 31 | 55 |
| WL1 | 8 | 32 | 12 | 36 | 9 | 33 | 13 | 37 | 10 | 34 | 14 | 38 | 11 | 35 | 15 | 39 |
| WL0 | 0 | 16 | 4 | 20 | 1 | 17 | 5 | 21 | 2 | 18 | 6 | 22 | 3 | 19 | 7 | 23 |

F I G. 28

| | SU0 | | SU1 | | SU2 | | SU3 | | SU4 | | SU5 | | SU6 | | SU7 | |
|---|---|---|---|---|---|---|---|---|---|---|---|---|---|---|---|---|
| | 1st | 2nd | 1st | 2nd | 1st | 2nd | 1st | 2nd | 1st | 2nd | 1st | 2nd | 1st | 2nd | 1st | 2nd |
| WL7 | 52 | 60 | 116 | 124 | 53 | 61 | 117 | 125 | 54 | 62 | 118 | 126 | 55 | 63 | 119 | 127 |
| WL6 | 44 | 56 | 108 | 120 | 45 | 57 | 109 | 121 | 46 | 58 | 110 | 122 | 47 | 59 | 111 | 123 |
| WL5 | 36 | 48 | 100 | 112 | 37 | 49 | 101 | 113 | 38 | 50 | 102 | 114 | 39 | 51 | 103 | 115 |
| WL4 | 28 | 40 | 92 | 104 | 29 | 41 | 93 | 105 | 30 | 42 | 94 | 106 | 31 | 43 | 95 | 107 |
| WL3 | 20 | 32 | 84 | 96 | 21 | 33 | 85 | 97 | 22 | 34 | 86 | 98 | 23 | 35 | 87 | 99 |
| WL2 | 12 | 24 | 76 | 88 | 13 | 25 | 77 | 89 | 14 | 26 | 78 | 90 | 15 | 27 | 79 | 91 |
| WL1 | 4 | 16 | 68 | 80 | 5 | 17 | 69 | 81 | 6 | 18 | 70 | 82 | 7 | 19 | 71 | 83 |
| WL0 | 0 | 8 | 64 | 72 | 1 | 9 | 65 | 73 | 2 | 10 | 66 | 74 | 3 | 11 | 67 | 75 |

FIG. 29

|  | SU0 | | SU1 | | SU2 | | SU3 | | SU4 | | SU5 | | SU6 | | SU7 | |
|---|---|---|---|---|---|---|---|---|---|---|---|---|---|---|---|---|
|  | 1st | 2nd | 1st | 2nd | 1st | 2nd | 1st | 2nd | 1st | 2nd | 1st | 2nd | 1st | 2nd | 1st | 2nd |
| WL7 | 97 | 120 | 99 | 121 | 101 | 122 | 103 | 123 | 105 | 124 | 107 | 125 | 109 | 126 | 111 | 127 |
| WL6 | 81 | 112 | 83 | 113 | 85 | 114 | 87 | 115 | 89 | 116 | 91 | 117 | 93 | 118 | 95 | 119 |
| WL5 | 65 | 96 | 67 | 98 | 69 | 100 | 71 | 102 | 73 | 104 | 75 | 106 | 77 | 108 | 79 | 110 |
| WL4 | 49 | 80 | 51 | 82 | 53 | 84 | 55 | 86 | 57 | 88 | 59 | 90 | 61 | 92 | 63 | 94 |
| WL3 | 33 | 64 | 35 | 66 | 37 | 68 | 39 | 70 | 41 | 72 | 43 | 74 | 45 | 76 | 47 | 78 |
| WL2 | 17 | 48 | 19 | 50 | 21 | 52 | 23 | 54 | 25 | 56 | 27 | 58 | 29 | 60 | 31 | 62 |
| WL1 | 1 | 32 | 3 | 34 | 5 | 36 | 7 | 38 | 9 | 40 | 11 | 42 | 13 | 44 | 15 | 46 |
| WL0 | 0 | 16 | 2 | 18 | 4 | 20 | 6 | 22 | 8 | 24 | 10 | 26 | 12 | 28 | 14 | 30 |

F I G. 30

|  | SU0 | | SU1 | | SU2 | | SU3 | | SU4 | | SU5 | | SU6 | | SU7 | |
|---|---|---|---|---|---|---|---|---|---|---|---|---|---|---|---|---|
|  | 1st | 2nd | 1st | 2nd | 1st | 2nd | 1st | 2nd | 1st | 2nd | 1st | 2nd | 1st | 2nd | 1st | 2nd |
| WL7 | 97 | 120 | 105 | 124 | 99 | 121 | 107 | 125 | 101 | 122 | 109 | 126 | 103 | 123 | 111 | 127 |
| WL6 | 81 | 112 | 89 | 116 | 83 | 113 | 91 | 117 | 85 | 114 | 93 | 118 | 87 | 115 | 95 | 119 |
| WL5 | 65 | 96 | 73 | 104 | 67 | 98 | 75 | 106 | 69 | 100 | 77 | 108 | 71 | 102 | 79 | 110 |
| WL4 | 49 | 80 | 57 | 88 | 51 | 82 | 59 | 90 | 53 | 84 | 61 | 92 | 55 | 86 | 63 | 94 |
| WL3 | 33 | 64 | 41 | 72 | 35 | 66 | 43 | 74 | 37 | 68 | 45 | 76 | 39 | 70 | 47 | 78 |
| WL2 | 17 | 48 | 25 | 56 | 19 | 50 | 27 | 58 | 21 | 52 | 29 | 60 | 23 | 54 | 31 | 62 |
| WL1 | 1 | 32 | 9 | 40 | 3 | 34 | 11 | 42 | 5 | 36 | 13 | 44 | 7 | 38 | 15 | 46 |
| WL0 | 0 | 16 | 8 | 24 | 2 | 18 | 10 | 26 | 4 | 20 | 12 | 28 | 6 | 22 | 14 | 30 |

F I G. 31

|  | SU0 | | SU1 | | SU2 | | SU3 | | SU4 | | SU5 | | SU6 | | SU7 | |
|---|---|---|---|---|---|---|---|---|---|---|---|---|---|---|---|---|
|  | 1st | 2nd | 1st | 2nd | 1st | 2nd | 1st | 2nd | 1st | 2nd | 1st | 2nd | 1st | 2nd | 1st | 2nd |
| WL7 | 49 | 60 | 113 | 124 | 51 | 61 | 115 | 125 | 53 | 62 | 117 | 126 | 55 | 63 | 119 | 127 |
| WL6 | 41 | 56 | 105 | 120 | 43 | 57 | 107 | 121 | 45 | 58 | 109 | 122 | 47 | 59 | 111 | 123 |
| WL5 | 33 | 48 | 97 | 112 | 35 | 50 | 99 | 114 | 37 | 52 | 101 | 116 | 39 | 54 | 103 | 118 |
| WL4 | 25 | 40 | 89 | 104 | 27 | 42 | 91 | 106 | 29 | 44 | 93 | 108 | 31 | 46 | 95 | 110 |
| WL3 | 17 | 32 | 81 | 96 | 19 | 34 | 83 | 98 | 21 | 36 | 85 | 100 | 23 | 38 | 87 | 102 |
| WL2 | 9 | 24 | 73 | 88 | 11 | 26 | 75 | 90 | 13 | 28 | 77 | 92 | 15 | 30 | 79 | 94 |
| WL1 | 1 | 16 | 65 | 80 | 3 | 18 | 67 | 82 | 5 | 20 | 69 | 84 | 7 | 22 | 71 | 86 |
| WL0 | 0 | 8 | 64 | 72 | 2 | 10 | 66 | 74 | 4 | 12 | 68 | 76 | 6 | 14 | 70 | 78 |

F I G. 32

| | SU0 | | SU1 | | SU2 | | SU3 | | SU4 | | SU5 | | SU6 | | SU7 | |
|---|---|---|---|---|---|---|---|---|---|---|---|---|---|---|---|---|
| | 1st | 2nd | 1st | 2nd | 1st | 2nd | 1st | 2nd | 1st | 2nd | 1st | 2nd | 1st | 2nd | 1st | 2nd |
| WL7 | 104 | 120 | 106 | 121 | 108 | 122 | 110 | 123 | 112 | 124 | 114 | 125 | 116 | 126 | 118 | 127 |
| WL6 | 88 | 105 | 90 | 107 | 92 | 109 | 94 | 111 | 96 | 113 | 98 | 115 | 100 | 117 | 102 | 119 |
| WL5 | 72 | 89 | 74 | 91 | 76 | 93 | 78 | 95 | 80 | 97 | 82 | 99 | 84 | 101 | 86 | 103 |
| WL4 | 56 | 73 | 58 | 75 | 60 | 77 | 62 | 79 | 64 | 81 | 66 | 83 | 68 | 85 | 70 | 87 |
| WL3 | 40 | 57 | 42 | 59 | 44 | 61 | 46 | 63 | 48 | 65 | 50 | 67 | 52 | 69 | 54 | 71 |
| WL2 | 24 | 41 | 26 | 43 | 28 | 45 | 30 | 47 | 32 | 49 | 34 | 51 | 36 | 53 | 38 | 55 |
| WL1 | 1 | 25 | 4 | 27 | 7 | 29 | 10 | 31 | 13 | 33 | 16 | 35 | 19 | 37 | 22 | 39 |
| WL0 | 0 | 2 | 3 | 5 | 6 | 8 | 9 | 11 | 12 | 14 | 15 | 17 | 18 | 20 | 21 | 23 |

F I G. 33

| | SU0 | | SU1 | | SU2 | | SU3 | | SU4 | | SU5 | | SU6 | | SU7 | |
|---|---|---|---|---|---|---|---|---|---|---|---|---|---|---|---|---|
| | 1st | 2nd | 1st | 2nd | 1st | 2nd | 1st | 2nd | 1st | 2nd | 1st | 2nd | 1st | 2nd | 1st | 2nd |
| WL7 | 104 | 120 | 112 | 124 | 106 | 121 | 114 | 125 | 108 | 122 | 116 | 126 | 110 | 123 | 118 | 127 |
| WL6 | 88 | 105 | 96 | 113 | 90 | 107 | 98 | 115 | 92 | 109 | 100 | 117 | 94 | 111 | 102 | 119 |
| WL5 | 72 | 89 | 80 | 97 | 74 | 91 | 82 | 99 | 76 | 93 | 84 | 101 | 78 | 95 | 86 | 103 |
| WL4 | 56 | 73 | 64 | 81 | 58 | 75 | 66 | 83 | 60 | 77 | 68 | 85 | 62 | 79 | 70 | 87 |
| WL3 | 40 | 57 | 48 | 65 | 42 | 59 | 50 | 67 | 44 | 61 | 52 | 69 | 46 | 63 | 54 | 71 |
| WL2 | 24 | 41 | 32 | 49 | 26 | 43 | 34 | 51 | 28 | 45 | 36 | 53 | 30 | 47 | 38 | 55 |
| WL1 | 1 | 25 | 13 | 33 | 4 | 27 | 16 | 35 | 7 | 29 | 19 | 37 | 10 | 31 | 22 | 39 |
| WL0 | 0 | 2 | 12 | 14 | 3 | 5 | 15 | 17 | 6 | 8 | 18 | 20 | 9 | 11 | 21 | 23 |

FIG. 34

|  | SU0 | | SU1 | | SU2 | | SU3 | | SU4 | | SU5 | | SU6 | | SU7 | |
|---|---|---|---|---|---|---|---|---|---|---|---|---|---|---|---|---|
|  | 1st | 2nd | 1st | 2nd | 1st | 2nd | 1st | 2nd | 1st | 2nd | 1st | 2nd | 1st | 2nd | 1st | 2nd |
| WL7 | 52 | 60 | 116 | 124 | 54 | 61 | 118 | 125 | 56 | 62 | 120 | 126 | 58 | 63 | 122 | 127 |
| WL6 | 44 | 53 | 108 | 117 | 46 | 55 | 110 | 119 | 48 | 57 | 112 | 121 | 50 | 59 | 114 | 123 |
| WL5 | 36 | 45 | 100 | 109 | 38 | 47 | 102 | 111 | 40 | 49 | 104 | 113 | 42 | 51 | 106 | 115 |
| WL4 | 28 | 37 | 92 | 101 | 30 | 39 | 94 | 103 | 32 | 41 | 96 | 105 | 34 | 43 | 98 | 107 |
| WL3 | 20 | 29 | 84 | 93 | 22 | 31 | 86 | 95 | 24 | 33 | 88 | 97 | 26 | 35 | 90 | 99 |
| WL2 | 12 | 21 | 76 | 85 | 14 | 23 | 78 | 87 | 16 | 25 | 80 | 89 | 18 | 27 | 82 | 91 |
| WL1 | 1 | 13 | 65 | 77 | 4 | 15 | 68 | 79 | 7 | 17 | 71 | 81 | 10 | 19 | 74 | 83 |
| WL0 | 0 | 2 | 64 | 66 | 3 | 5 | 67 | 69 | 6 | 8 | 70 | 72 | 9 | 11 | 73 | 75 |

F I G. 35

|  | SU0 | | SU1 | | SU2 | | SU3 | | SU4 | | SU5 | | SU6 | | SU7 | |
|---|---|---|---|---|---|---|---|---|---|---|---|---|---|---|---|---|
|  | 1st | 2nd | 1st | 2nd | 1st | 2nd | 1st | 2nd | 1st | 2nd | 1st | 2nd | 1st | 2nd | 1st | 2nd |
| WL7 | 104 | 120 | 106 | 121 | 108 | 122 | 110 | 123 | 112 | 124 | 114 | 125 | 116 | 126 | 118 | 127 |
| WL6 | 88 | 105 | 90 | 107 | 92 | 109 | 94 | 111 | 96 | 113 | 98 | 115 | 100 | 117 | 102 | 119 |
| WL5 | 72 | 89 | 74 | 91 | 76 | 93 | 78 | 95 | 80 | 97 | 82 | 99 | 84 | 101 | 86 | 103 |
| WL4 | 56 | 73 | 58 | 75 | 60 | 77 | 62 | 79 | 64 | 81 | 66 | 83 | 68 | 85 | 70 | 87 |
| WL3 | 40 | 57 | 42 | 59 | 44 | 61 | 46 | 63 | 48 | 65 | 50 | 67 | 52 | 69 | 54 | 71 |
| WL2 | 24 | 41 | 26 | 43 | 28 | 45 | 30 | 47 | 32 | 49 | 34 | 51 | 36 | 53 | 38 | 55 |
| WL1 | 8 | 25 | 10 | 27 | 12 | 29 | 14 | 31 | 16 | 33 | 18 | 35 | 20 | 37 | 22 | 39 |
| WL0 | 0 | 9 | 1 | 11 | 2 | 13 | 3 | 15 | 4 | 17 | 5 | 19 | 6 | 21 | 7 | 23 |

F I G. 36

| | SU0 | | SU1 | | SU2 | | SU3 | | SU4 | | SU5 | | SU6 | | SU7 | |
|---|---|---|---|---|---|---|---|---|---|---|---|---|---|---|---|---|
| | 1st | 2nd | 1st | 2nd | 1st | 2nd | 1st | 2nd | 1st | 2nd | 1st | 2nd | 1st | 2nd | 1st | 2nd |
| WL7 | 104 | 120 | 112 | 124 | 106 | 121 | 114 | 125 | 108 | 122 | 116 | 126 | 110 | 123 | 118 | 127 |
| WL6 | 88 | 105 | 96 | 113 | 90 | 107 | 98 | 115 | 92 | 109 | 100 | 117 | 94 | 111 | 102 | 119 |
| WL5 | 72 | 89 | 80 | 97 | 74 | 91 | 82 | 99 | 76 | 93 | 84 | 101 | 78 | 95 | 86 | 103 |
| WL4 | 56 | 73 | 64 | 81 | 58 | 75 | 66 | 83 | 60 | 77 | 68 | 85 | 62 | 79 | 70 | 87 |
| WL3 | 40 | 57 | 48 | 65 | 42 | 59 | 50 | 67 | 44 | 61 | 52 | 69 | 46 | 63 | 54 | 71 |
| WL2 | 24 | 41 | 32 | 49 | 26 | 43 | 34 | 51 | 28 | 45 | 36 | 53 | 30 | 47 | 38 | 55 |
| WL1 | 8 | 25 | 16 | 33 | 10 | 27 | 18 | 35 | 12 | 29 | 20 | 37 | 14 | 31 | 22 | 39 |
| WL0 | 0 | 9 | 4 | 17 | 1 | 11 | 5 | 19 | 2 | 13 | 6 | 21 | 3 | 15 | 7 | 23 |

FIG. 37

| | SU0 | | SU1 | | SU2 | | SU3 | | SU4 | | SU5 | | SU6 | | SU7 | |
|---|---|---|---|---|---|---|---|---|---|---|---|---|---|---|---|---|
| | 1st | 2nd | 1st | 2nd | 1st | 2nd | 1st | 2nd | 1st | 2nd | 1st | 2nd | 1st | 2nd | 1st | 2nd |
| WL7 | 52 | 60 | 116 | 124 | 54 | 61 | 118 | 125 | 56 | 62 | 120 | 126 | 58 | 63 | 122 | 127 |
| WL6 | 44 | 53 | 108 | 117 | 46 | 55 | 110 | 119 | 48 | 57 | 112 | 121 | 50 | 59 | 114 | 123 |
| WL5 | 36 | 45 | 100 | 109 | 38 | 47 | 102 | 111 | 40 | 49 | 104 | 113 | 42 | 51 | 106 | 115 |
| WL4 | 28 | 37 | 92 | 101 | 30 | 39 | 94 | 103 | 32 | 41 | 96 | 105 | 34 | 43 | 98 | 107 |
| WL3 | 20 | 29 | 84 | 93 | 22 | 31 | 86 | 95 | 24 | 33 | 88 | 97 | 26 | 35 | 90 | 99 |
| WL2 | 12 | 21 | 76 | 85 | 14 | 23 | 78 | 87 | 16 | 25 | 80 | 89 | 18 | 27 | 82 | 91 |
| WL1 | 4 | 13 | 68 | 77 | 6 | 15 | 70 | 79 | 8 | 17 | 72 | 81 | 10 | 19 | 74 | 83 |
| WL0 | 0 | 5 | 64 | 69 | 1 | 7 | 65 | 71 | 2 | 9 | 66 | 73 | 3 | 11 | 67 | 75 |

F I G. 38

SEMICONDUCTOR MEMORY DEVICE

CROSS-REFERENCE TO RELATED APPLICATIONS

This application is a continuation application of U.S. application Ser. No. 17/244,306, filed Apr. 29, 2021, which is a continuation application of U.S. application Ser. No. 16/852,733, filed Apr. 20, 2020 (now U.S. Pat. No. 11,024,386, issued Jun. 1, 2021), which is a continuation application of U.S. application Ser. No. 16/298,135, filed Mar. 11, 2019 (now U.S. Pat. No. 10,672,478, issued Jun. 2, 2020), which is based upon and claims the benefit of priority from Japanese Patent Application No. 2018-175787, filed Sep. 20, 2018, the entire contents of which are incorporated herein by reference.

FIELD

Embodiments described herein relate generally to a semiconductor memory device.

BACKGROUND

A semiconductor memory in which memory cells are three-dimensionally stacked is known.

BRIEF DESCRIPTION OF THE DRAWINGS

FIGS. 3 and 4 show layout views of selection gate lines and word lines of a semiconductor memory device according to the first embodiment;

FIG. 5 shows a vertical section of a block of a semiconductor memory device according to the first embodiment;

FIGS. 6 and 7 show cross and vertical sections of a memory cell transistor of a semiconductor memory device according to the first embodiment;

FIG. 10 shows an order of writing data in a semiconductor memory device according to the first embodiment;

FIG. 13 shows pre-verify target string units and pre-program target string units in a write operation for each write target string unit in a semiconductor memory device according to the first embodiment;

FIG. 15 shows a timing chart of the transition of voltages of signal lines during a write operation in a semiconductor memory device according to the second embodiment;

FIG. 18 shows a data writing order in a semiconductor memory device according to a fourth embodiment;

FIG. 19 shows a flowchart of a write operation in a semiconductor memory device according to the fourth embodiment;

FIG. 20 shows pre-verify target string units and pre-program target string units in a write operation for each write target string unit in a semiconductor memory unit according to the fourth embodiment;

FIG. 21 shows a command sequence for writing data into a semiconductor memory device according to the fourth embodiment;

FIG. 22 shows a data writing order in a semiconductor memory device according to a modification example of the fourth embodiment;

FIG. 25 shows a data writing order in a semiconductor memory device according to the fifth embodiment;

FIG. 27 shows pre-verify target string units and pre-program target string units in the write operation for each write target string unit in a semiconductor memory device according to the fifth embodiment;

FIGS. 28, 29, 30, 31, 32, 33, 34, and 35 show first to eighth examples of a data writing order in a semiconductor memory device according to a sixth embodiment, respectively;

FIG. 36 shows a first example of a data writing order in a semiconductor memory device according to a seventh embodiment;

FIG. 37 shows a second example of a data writing order in a semiconductor memory device according to the seventh embodiment; and FIG. 38 shows a third example of a data writing order in a semiconductor memory device according to the seventh embodiment.

DETAILED DESCRIPTION

In general, according to one embodiment, a semiconductor memory device includes: a first memory cell; a second memory cell; a first word line; a second word line; and a first bit line. The first memory cell is capable of holding data. The second memory cell is capable of holding data. The first word line is coupled to the first memory cell. The second word line is coupled to the second memory cell. The first bit line is capable of being electrically coupled to both the first memory cell and the second memory cell. The first memory cell shares a semiconductor layer with the second memory cell, and faces the second memory cell across the semiconductor layer. The semiconductor memory device is configured to execute a first operation, a second operation, and a third operation to write data into the first memory cell. In the first operation, a first voltage is applied to the second word line. In the second operation, after the first operation, a second voltage higher than the first voltage is applied to the second word line. In the third operation, after the second operation, a third voltage higher than the second voltage is applied to the first word line, and a fourth voltage lower than both the second voltage and the third voltage is applied to the second word line.

1. First Embodiment

A semiconductor memory device according to the first embodiment will be explained. In the explanation below, a memory system which uses a NAND flash memory as the semiconductor memory device will be discussed by way of example.

1.1 Configuration

First, the configuration of the memory system according to the present embodiment will be explained.

1.1.1 Overall Configuration

The overall configuration of the memory system according to the present embodiment will be discussed with reference to FIG. 1.

Figure 1:
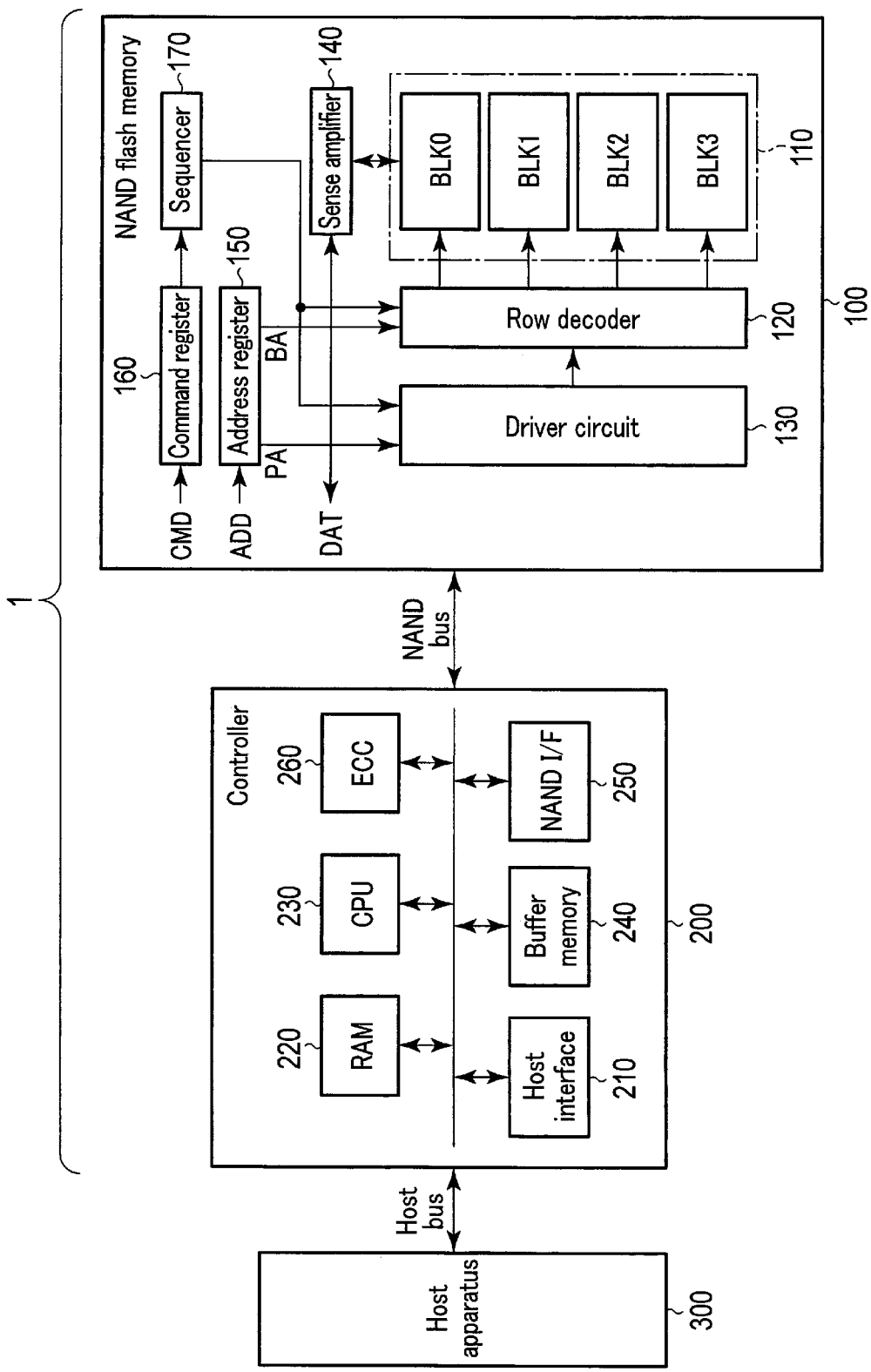
FIG. 1 is a block diagram of a system which utilizes a semiconductor memory device according to a first embodiment.

As illustrated in FIG. 1, the memory system 1 includes a NAND flash memory 100 and a controller 200. The NAND flash memory 100 and the controller 200 may be combined to constitute a single semiconductor equipment, including but not limited to a memory card such as an SD™ card, and a solid state drive (SSD). The controller 200 may be a system-on-chip (SoC) controller.

The NAND flash memory 100 includes a plurality of memory cells to store data in a non-volatile manner. The controller 200 is connected to the NAND flash memory 100 via a NAND bus, and is also connected to a host apparatus 300 via host bus. The controller 200 controls the NAND flash memory 100, and accesses the NAND flash memory 100 in response to an instruction received from the host apparatus 300. The host apparatus 300 may be, for example, a digital camera or a personal computer, and the host bus may be, for example, of the bus architecture in compliance with the SD™ interface. The NAND bus is used to exchange signals in a manner in compliance with the NAND interface.

1.1.2 Configuration of Controller 200

Continuing to refer to FIG. 1, the configuration of the controller 200 will be explained in detail. The controller 200 of FIG. 1 includes a host interface circuit 210, an internal memory (RAM) 220, a processor (CPU) 230, a buffer memory 240, a NAND interface circuit 250, and an ECC (Error Checking and Correcting) circuit 260.

The host interface circuit 210 is connected to the host apparatus 300 via the host bus, and transfers instructions and data received from the host apparatus 300 to the processor 230 and to the buffer memory 240, respectively. Furthermore, in response to an instruction from the processor 230, the host interface circuit 210 transfers data stored in the buffer memory 240 to the host apparatus 300.

The processor 230 controls operations of the controller 200. For instance, upon receipt of a data write instruction from the host apparatus 300, the processor 230 sends a write command to the NAND interface circuit 250. The data reading and the data erasing are performed in similar ways. The processor 230 implements various operations, such as wear leveling, to manage the NAND flash memory 100. The operation of the controller 200 discussed below may be implemented by one or more processors executing a software or firmware program, or may be realized by hardware.

The NAND interface circuit 250 is connected to the NAND flash memory 100 via the NAND bus, and controls communications with the NAND flash memory 100. In response to an instruction received from the processor 230, the NAND interface circuit 250 transmits various signals to the NAND flash memory 100, and receives various signals from the NAND flash memory 100.

The buffer memory 240 temporarily stores data to be written in the NAND flash memory 100 (write data) and data read out from the NAND flash memory 100 (read data).

The internal memory 220 includes a semiconductor memory such as a dynamic random access memory (DRAM) and a static random access memory (SRAM), and is used as a workspace for the processor 230. The internal memory 220 stores firmware for controlling the NAND flash memory 100, and data tables for various control and/or management operations.

The ECC circuit 260 executes error detection and error correction operations for the data stored in the NAND flash memory 100. When writing data into the NAND flash memory 100, the ECC circuit 260 generates error correction codes and associates the error correction codes with the write data. When reading out data, the ECC circuit 260 decodes the error correction codes of the read data.

1.1.3 Configuration of NAND Flash Memory 100

1.1.3.1 Overall Configuration of NAND Flash Memory 100

Next, the configuration of the NAND flash memory 100 is explained. The NAND flash memory 100 of FIG. 1 includes a memory cell array 110, a row decoder 120, a driver circuit 130, a sense amplifier 140, an address register 150, a command register 160, and a sequencer 170.

The memory cell array 110 includes a plurality of blocks BLK, which include a plurality of non-volatile memory cells each associated with a row and a column. The memory cell array 110 stores the data supplied from the controller 200.

The row decoder 120 selects one of the blocks BLK, and further selects one or more rows of the selected block BLK.

The driver circuit 130 applies a voltage to the selected block BLK via the row decoder 120.

The sense amplifier 140, at the time of reading data or verifying the data, senses the data read from the memory cell array 110 and performs the necessary computations based on the sensed data. This read data DAT is output to the controller 200. At the time of writing data, the sense amplifier 140 transfers the write data DAT received from the controller 200, to the memory cell array 110.

The address register 150 holds an address ADD received from the controller 200. The command register 160 holds a command CMD received from the controller 200.

The sequencer 170 controls operations of the NAND flash memory 100, based on various types of information held in the registers 150 and 160.

1.1.3.2 Configuration of Memory Cell Array 110

The memory cell array 110 of the semiconductor memory device according to the present embodiment will be explained.

<Circuit Configuration>

Figure 2:
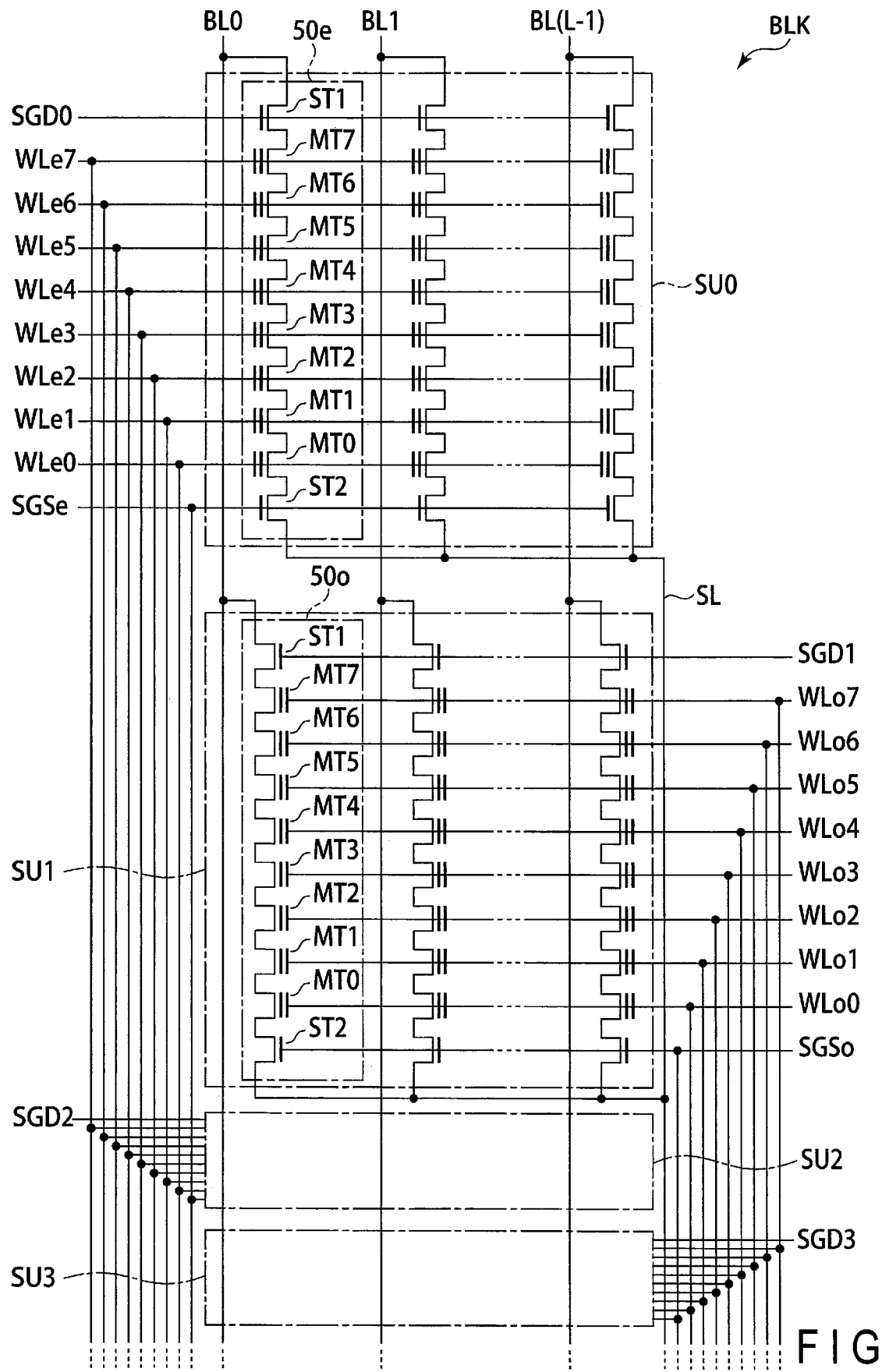
FIG. 2 is a circuit diagram of a memory cell array of a semiconductor memory device according to the first embodiment.

First, the circuit configuration of the memory cell array 110 will be explained with reference to FIG. 2. FIG. 2 shows an equivalent circuit of one of the blocks BLK. As illustrated in FIG. 2, the block BLK includes a plurality of string units SU (SU0, SU1, SU2, . . . ), and each string unit SU includes a plurality of NAND strings 50.

Hereinafter, to differentiate the NAND strings of the string units with even numbers (even string units) SUe (SU0, SU2, SU4, . . . ) from the NAND strings of the string units with odd numbers (odd string units) SUo (SU1, SU3, SU5, . . . ), they will be collectively referred to as NAND strings 50e and NAND strings 50o, respectively.

Each of the NAND strings 50 may include eight memory cell transistors MT (MT0 to MT7) and selection transistors ST1 and ST2. Each memory cell transistor MT includes a control gate and a charge accumulation layer, and holds data in a non-volatile manner. The eight memory cell transistors MT are coupled in series between the source of the selection transistor ST1 and the drain of the selection transistor ST2.

The gates of the selection transistors ST1 in each string unit SU are coupled to a single selection gate line SGD (SGD0, SGD1, . . . ). Each of the selection gate lines SGD is independently controlled by the row decoder 120. The gates of the selection transistors ST2 in each of the even string units SUe (SU0, SU2, . . . ) may be commonly coupled to the selection gate line SGSe, and the gates of the selection transistors ST2 in each of the odd string units SUo (SU1, SU3, . . . ) may be commonly coupled to the selection gate line SGSo. The selection gate lines SGSe and SGSo may be controlled either commonly or independently.

The control gates of the memory cell transistors MT (MT0 to MT7) included in the even string units SUe of the same block BLK are commonly coupled to the corresponding word lines WLe (WLe0 to WLe7), respectively. The control gates of the memory cell transistors MT (MT0 to MT7) included in the odd string unit SUo are commonly coupled to the corresponding word lines WLo (WLo0 to WLo7), respectively. The word lines WLe and the word lines WLo are independently controlled by the row decoder 120.

A block BLK may be a minimum size unit for data erasing. In other words, the data stored in all the memory cell transistors MT in the same block BLK is erased at a time. However, the data may be erased in every string unit SU, or in units smaller than a string unit SU.

In the memory cell array 110, the drains of the selection transistors ST1 of the NAND strings 50 in the same column are commonly coupled to the same bit line BL (BL0 to BL(L−1), where L is a natural number larger than or equal to 2). That is, a bit line BL is commonly coupled to the NAND strings 50e and 50o in the same column across different string units SU. The sources of all of the selection transistors ST2 are commonly coupled to a source line SL.

In other words, each string unit SU includes a plurality of NAND strings 50 that are coupled to their respective bit lines BL and to the same selection gate line SGD. Each block BLK includes a plurality of string units SU that share the word lines WL. A memory cell array 110 includes a plurality of blocks BLK that share bit lines BL. In the memory cell array 110, the memory cell transistors MT and the selection transistors ST1 and ST2 are three-dimensionally stacked by forming the selection gate line SGS, the word lines WL, and the selection gate line SGD in layers on the semiconductor substrate.

<Planar Layout of Memory Cell Array>

Next, the planar layout of the memory cell array 110 is described. FIG. 3 shows a planar layout of the selection gate lines SGD of a certain block BLK along the plane of the semiconductor substrate (referred to as an "X-Y plane"). In this example, one block BLK includes eight selection gate lines SGD (SDG0 to SGD7).

As illustrated in FIG. 3, 17 conductive layers (interconnect lines) 10 (10-0a to 10-7a, 10-0b to 10-7b, and 10-0c) extending along the X direction are arranged in the Y direction orthogonal to the X direction. Each conductive layer 10 functions as the selection gate line SGD. In the example of FIG. 3, the conductive layers 10-0a, 10-1a, 10-2a, 10-1b, 10-2b, 10-3a, 10-4a, 10-3b, 10-4b, 10-5a, 10-6a, 10-5b, 10-6b, 10-7a, 10-0b, 10-7b, and 10-0c are arranged in the Y direction. The two conductive layers 10-0a and 10-0c positioned at the opposite ends of the block BLK in the Y direction, and the conductive layer 10-0b positioned between the conductive layers 10-7a and 10-7b are electrically coupled to each other to function as the selection gate line SGD0. Furthermore, the conductive layers 10-1a and 10-1b are electrically coupled to each other to function as the selection gate line SGD1. The conductive layers 10-2a and 10-2b are electrically coupled to each other to function as the selection gate line SGD2, and the conductive layers 10-3a and 10-3b are electrically coupled to each other to function as the selection gate line SGD3. The same arrangement is applied to other conductive layers for the other selection gate lines SGD4 to SGD7. The conductive layers 10-4a and 10-4b are electrically coupled to each other to function as the selection gate line SGD4; the conductive layers 10-5a and 10-5b are electrically coupled to each other to function as the selection gate line SGD5; the conductive layers 10-6a and 10-6b are electrically coupled to each other to function as the selection gate line SGD6; and the conductive layers 10-7a and 10-7b are electrically coupled to each other to function as the selection gate line SGD7.

In the block BLK, the conductive layers 10 that are adjacent to each other in the Y direction are separated by an insulating layer (not shown). The regions in which the insulating layers are located are referred to as slits SLT2. In each slit SLT2, the insulating layer is buried from the surface of the semiconductor substrate to at least the layer where the conductive layers 10 are arranged. Furthermore, in the memory cell array 110, a plurality of blocks BLK as illustrated in FIG. 3 are arranged in the Y direction. The blocks BLK that are adjacent to each other in the Y direction are also separated by an insulating layer (not shown). The regions in which these insulating layers are located are referred to as slits SLT1.

A plurality of pillars MP (MP0 to MP31) extending along the Z direction are arranged between the conductive layers 10 that are adjacent to each other in the Y direction to form the selection transistors ST1 and ST2 and the memory cell transistors MT. The plurality of pillars are referred to as memory pillars. The Z direction is orthogonal to the X-Y plane, or in other words, vertical to the surface of the semiconductor substrate.

In particular, the memory pillars MP0 and MP16 are arranged between the conductive layers 10-0a and 10-1a; the memory pillars MP8 and MP24 are arranged between the conductive layers 10-1a and 10-2a; the memory pillars MP1 and MP17 are arranged between the conductive layers 10-2a and 10-1b; and the memory pillars MP9 and MP25 are arranged between the conductive layers 10-1b and 10-2b. Furthermore, the memory pillars MP2 and MP18 are arranged between the conductive layers 10-2b and 10-3a; the memory pillars MP10 and MP26 are arranged between the conductive layers 10-3a and 10-4a; the memory pillars MP3 and MP19 are arranged between the conductive layers 10-4*a* and 10-3*b*; and the memory pillars MP11 and MP27 are arranged between the conductive layers 10-3*b* and 10-4*b*. The memory pillars MP4 and MP20 are arranged between the conductive layers 10-4*b* and 10-5*a*; the memory pillars MP12 and MP28 are arranged between the conductive layers 10-5*a* and 10-6*a*; the memory pillars MP5 and MP21 are arranged between the conductive layers 10-6*a* and 10-5*b*; and the memory pillars MP13 and MP29 are arranged between the conductive layers 10-5*b* and 10-6*b*. Also, memory pillars MP6 and MP22 are arranged between the conductive layers 10-6*b* and 10-7*a*; the memory pillars MP14 and MP30 are arranged between the conductive layers 10-7*a* and 10-0*b*; the memory pillars MP7 and MP23 are arranged between the conductive layers 10-0*b* and 10-7*b*; and the memory pillars MP15 and MP31 are arranged between the conductive layers 10-7*b* and 10-0*c*. The memory pillars MP are structures that are used to form the selection transistors ST1 and ST2 and the memory cell transistors MT, which will be discussed in detail later.

The memory pillars MP0 to MP7 are located along the Y direction. The memory pillars MP16 to MP23 are located along the Y direction side by side with the memory pillars MP0 to MP7 in the X direction. That is, the alignment of the memory pillars MP0 to MP7 is parallel to the alignment of the memory pillars MP16 to MP23.

Similarly, the memory pillars MP8 to MP15 are located along the Y direction, and the memory pillars MP24 to MP31 are also located along the Y direction. The alignment of the memory pillars MP8 to MP15 is positioned between the alignment of the memory pillars MP0 to MP7 and the alignment of the memory pillars MP16 to MP23 with respect to the X direction. The alignment of the memory pillars MP24 to MP31 is positioned in such a manner that the alignment of the memory pillars MP16 to MP23 is interposed between the alignment of the memory pillars MP24 to MP31 and the alignment of the memory pillars MP8 to MP15, with respect to the X direction. The alignment of the memory pillars MP8 to MP15 is positioned parallel to the alignment of the memory pillars MP24 to MP31.

The memory pillars MP0 to MP7 and the memory pillars MP16 to MP23 are arranged to form a staggered pattern together with the memory pillars MP8 to MP15 and the memory pillars MP24 to MP31. In particular, the former memory pillars MP0 to MP7 and MP16 to MP23 are shifted from the latter memory pillars MP8 to MP15 and MP24 to MP31 by one slit interval of the slits SLT2 in the Y direction. In other words, each memory pillar MP is buried between two adjacent conductive layers 10 in the Y direction and in part of the corresponding slit SLT2. Thus, one slit SLT2 is present between any two memory pillars MP that are adjacent to each other in the Y direction. For two adjacent blocks BLK, no memory pillar MP is provided between the conductive layer 10-0*a* of one block and the conductive layer 10-0*c* of the other block that face each other across the slit SLT1.

Two bit lines BL are arranged above a certain memory pillar MP. Of the two bit lines BL, only one bit line BL is electrically coupled to that memory pillar MP.

For example, two bit lines BL0 and BL1 are arranged above the memory pillars MP0 to MP7. The bit line BL0 is commonly coupled to the memory pillars MP0, MP2, MP4, and MP6, while the bit line BL1 is commonly coupled to the memory pillars MP1, MP3, MP5, and MP7. Two bit lines BL2 and BL3 are arranged above the memory pillars MP8 to MP15. The bit line BL2 is commonly coupled to the memory pillars MP8, MP10, MP12, and MP14, while the bit line BL3 is commonly coupled to the memory pillars MP9, MP11, MP13, and MP15. Two bit lines BL4 and BL5 are arranged above the memory pillars MP16 to MP23. The bit line BL4 is commonly coupled to the memory pillars MP16, MP18, MP20, and MP22, while the bit line BL5 is commonly coupled to the memory pillars MP17, MP19, MP21, and MP23. Two bit lines BL6 and BL7 are arranged above the memory pillars MP24 to MP31. The bit line BL6 is commonly coupled to the memory pillars MP24, MP26, MP28, and MP30, while the bit line BL7 is commonly coupled to the memory pillars MP25, MP27, MP29, and MP31.

Figure 4:
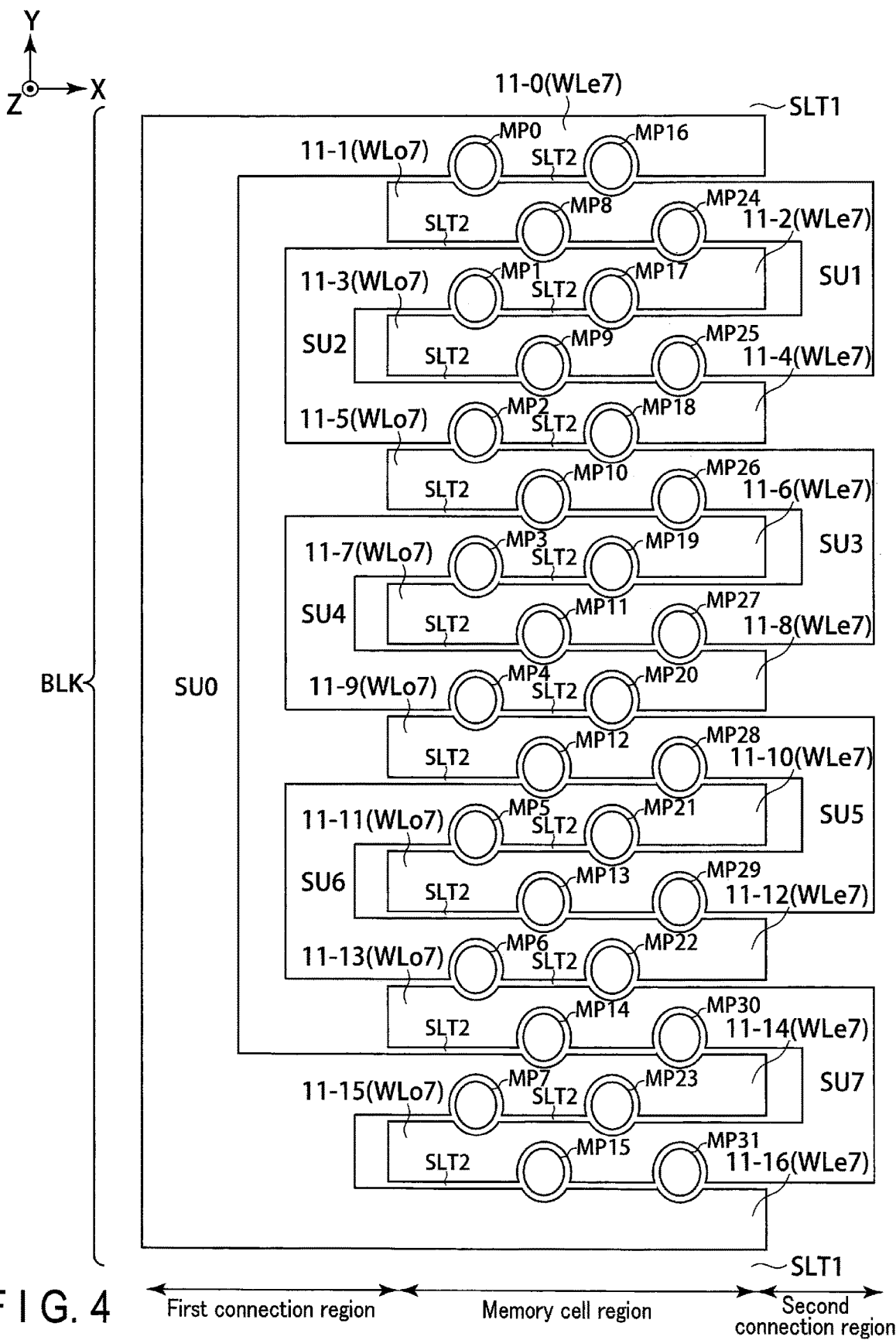

Like FIG. 3, FIG. 4 shows a planar layout of the word lines WL on the X-Y plane. The layout of FIG. 4 corresponds to the one block illustrated in FIG. 3, showing conductive layers 11 which is arranged below the conductive layers 10 shown in FIG. 3.

As illustrated in FIG. 4, 17 conductive layers 11 (11-0 to 11-16) extending along the X direction are arranged in the Y direction. The conductive layers 11-0 to 11-16 are positioned immediately below the conductive layers 10-0*a*, 10-1*a*, 10-2*a*, 10-1*b*, 10-2*b*, 10-3*a*, 10-4*a*, 10-3*b*, 10-4*b*, 10-5*a*, 10-6*a*, 10-5*b*, 10-6*b*, 10-7*a*, 10-0*b*, 10-7*b*, and 10-0*c*, with an insulating layer interposed therebetween. Each of the conductive layers 11 functions as the word line WLe7 or WLo7. The other word lines WL0 to WL6 are configured in a similar manner.

In the example of FIG. 4, the conductive layers 11-0, 11-2, 11-4, 11-6, 11-8, 11-10, 11-12, 11-14, and 11-16 extend to their respective ends in a first direction along the X direction (referred to as first connection ends). The conductive layers 11-0, 11-14, and 11-16 are coupled together, the conductive layers 11-2 and 11-4 are coupled together, the conductive layers 11-6 and 11-8 are coupled together, and the conductive layers 11-10 and 11-12 are coupled together. Each of the conductive layers 11-0, 11-2, 11-4, 11-6, 11-8, 11-10, 11-12, 11-14, and 11-16 functions as the word line WLe7.

The conductive layers 11-1, 11-3, 11-5, 11-7, 11-9, 11-11, 11-13, and 11-15 extend to their respective ends (referred to as second connection ends) in a second direction opposite to the first direction along the X direction. The conductive layers 11-1 and 11-3 are coupled together, the conductive layers 11-5 and 11-7 are coupled together, the conductive layers 11-9 and 11-11 are coupled together, and the conductive layers 11-13 and 11-15 are coupled together, each of which functions as the word line WLo7.

The memory cell transistors MT are provided between the first connection ends and the second connection ends. In regions in which the memory cell transistors MT are formed (memory cell regions), the conductive layers 11 which are adjacent to each other in the Y direction are separated by the slits SLT2 described by referring to FIG. 3. Similarly, between the blocks BLK which are adjacent to each other in the Y direction, the conductive layer 11 of one block BLK and the conductive layer of the other block BLK which are adjacent to each other in the Y direction are separated by the slits SLT1. Furthermore, the memory pillars MP0 to MP31 are located in the memory cell regions as explained with reference to FIG. 3.

The layers in which the other word lines WL and the selection gate lines SGS are configured similarly to the configuration of the above-described layer.

<Cross-sectional Structure of Memory Cell Array>

The cross-sectional structure of the memory cell array 110 is now discussed. FIG. 5 shows a vertical section of the block BLK, taken along the Y direction. By way of example, FIG. 5 illustrates a vertical section of a region taken along the bit line BL0 shown in FIG. 3.

As illustrated in FIG. 5, the conductive layers 12 functioning as the selection gate lines SGS is located above the semiconductor substrate (e.g., p-type well region) 13. Eight conductive layers 11 functioning as the word lines WL0 to WL7 are stacked in the Z direction above the selection gate lines SGS. The layout views of these conductive layers for the word lines 11 and the SGS 12 are presented in FIG. 4. The conductive layers 10 functioning as the selection gate lines SGD is arranged above the word lines 11. As for the layer for the SGD, its layout view has already been discussed with reference to FIG. 3.

The slits SLT2 and the memory pillars MP are arranged alternately along the Y direction to each extend through the SGD 10 to the semiconductor substrate 13. As discussed above, the slits SLT2 are formed of insulating layers. The insulation films of the slit SLT2 may include contact plugs to apply a voltage to a region of the semiconductor substrate 13. For example, contact plugs may be provided to couple the sources of the selection transistors ST2 to a source line that is not shown.

The layer for the SGS 12 includes the selection gate lines SGSe and the selection gate lines SGSo which are alternately arranged with slits SLT2 or memory pillars MP interposed in-between. Similarly, each of the layers for the word lines WL 11 includes the word lines WLo and the word lines WLe which are alternately arranged with slits SLT2 or memory pillars MP interposed therebetween.

The slits SLT1 are arranged between the blocks BLK which are adjacent to each other in the Y direction. As mentioned above, the slits SLT1 are formed of an insulating layer. The insulating layers of the slits SLT1 may include contact plugs to apply a voltage to a region of the semiconductor substrate 13. For example, contact plugs may be provided to couple the sources of the selection transistors ST2 to the source line. The width of the slit SLT1 in the Y direction is greater than the width of the slit SLT2 in the Y direction.

A contact plug 16 is arranged on each of the memory pillars MP. The conductive layers 15 functioning as the bit lines BL is arranged along the Y direction in a manner so that the bit lines BL are commonly coupled to the corresponding contact plugs 16.

<Structure of Memory Pillar and Memory Cell Transistor>

The structure of each memory pillar MP and each memory cell transistor MT will be explained. FIG. 6 is a cross section of the memory pillar MP taken along the X-Y plane, and FIG. 7 is a vertical section of the same taken along the Y-Z plane. Particularly, FIGS. 6 and 7 illustrate the area in which two memory cell transistors MT are formed.

As illustrated in FIGS. 6 and 7, the memory pillar MP includes an insulating layer 30, a semiconductor layer 31, and insulating layers 32 to 34 which are coaxially arranged along the Z direction. The insulating layer 30 may be a silicon dioxide film. The semiconductor layer 31 is arranged to surround the insulating layer 30, and provides a region in which the channels of the memory cell transistors MT are formed. The semiconductor layer 31 may be formed of polycrystalline silicon. The insulating layer 32 is arranged to surround the semiconductor layer 31, and to function as a gate insulating layer of the memory cell transistor MT. The insulating layer 32 may have a stacked structure including a silicon dioxide film and a silicon nitride film. The insulating layer 33 is arranged to surround the semiconductor layer 31, and functions as a charge accumulation layer of the memory cell transistor MT. The insulating layer 33 may be a silicon nitride film. The insulating layer 34 is arranged to surround the insulating layer 33, and functions as a block insulating layer of the memory cell transistor MT. The insulating layer 34 may be a silicon dioxide film. Outside the memory pillar MP, an insulating layer 37 is buried in the slit SLT2. The insulating layer 37 may be a silicon dioxide film.

An aluminum oxide (AlO) layer 35 may be arranged around the above-described memory pillar MP. A barrier metal layer (e.g., a titanium nitride (TiN) film) 36 may be formed around the AlO layer 35. The conductive layers 11 that function as the word lines WL are arranged around the barrier metal layer 36. The conductive layers 11 may be formed of tungsten.

With the above-described configuration, two memory cell transistors MT are formed along the Y direction in one region of the memory pillar MP shown in FIGS. 6 and 7. The selection transistors ST1 and ST2 are similarly formed.

Figure 8:
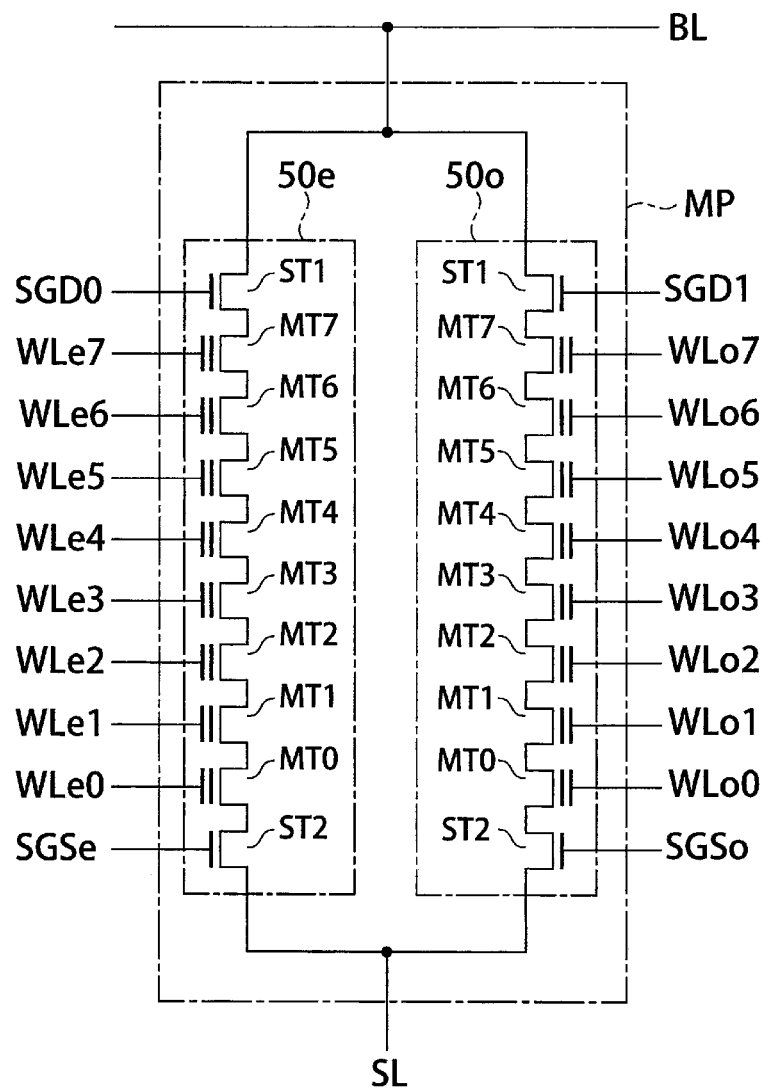
FIG. 8 shows an equivalent circuit of transistors formed in a pillar of a semiconductor memory device according to the first embodiment.

FIG. 8 shows an equivalent circuit of the transistors formed in the memory pillar MP. As illustrated in FIG. 8, two NAND strings 50o and 50e are formed in one memory pillar MP. In other words, a pair of selection transistors ST1 arranged in the one memory pillar MP are coupled to different selection gate lines SGD. The pair of memory cell transistors MT0 to MT7 are respectively coupled to different word lines WLo and WLe. Furthermore, the pair of selection transistors ST2 are coupled to different selection gate lines SGSo and SGSe. The two NAND strings 50o and 50e in the same memory pillar MP are coupled to the same bit line BL, and to the same source line SL. The two NAND strings 50o and 50e formed in the same memory pillar MP share a back gate (semiconductor layer 31).

<Threshold Voltage Distribution of Memory Cell Transistor>

In an example introduced here, a single memory cell transistor MT may be configured to hold 3-bit data. The bits of this 3-bit data will be referred to, from the least significant bit, as a lower bit, middle bit, and upper bit. In the memory cell transistors that are coupled to the same word line, a set of lower bits held in those memory cell transistors is denoted as a lower page, a set of middle bits held in the those memory cells transistors is denoted as a middle page, and a set of upper bits held in the those memory cells transistors is denoted as an upper page. That is, three pages are assigned to one word line WL, which means that one string unit SU coupled to eight word lines WL has a capacity of 24 pages. In other words, a "page" can be defined as a portion of the memory space that is formed by the memory cell transistors coupled to the same word line. The data writing and reading may be performed for every page.

Figure 9:
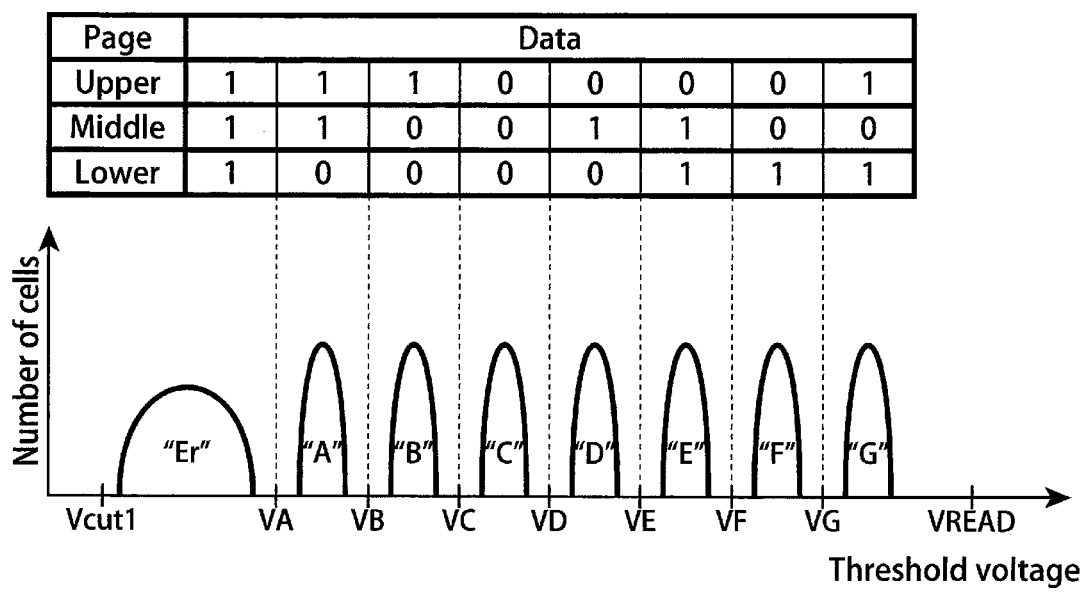
FIG. 9 schematically shows a relation of stored bit values and threshold voltage distribution for a memory cell of a semiconductor memory device according to the first embodiment.

FIG. 9 shows the possible bit values to be stored in each memory cell transistor MT, threshold voltage distribution, and read voltages used for reading data.

As shown in FIG. 9, one memory cell transistor MT may be set in one of eight possible states in accordance with the threshold voltage states. These eight states are referred to as "Er" state, "A" state, "B" state, "C" state, . . . and "G" state from the lowest threshold voltage state.

The threshold voltage of the memory cell transistor MT in the "Er" state is larger than the voltage Vcut1 (which may be a negative voltage) and lower than the read voltage VA, which corresponds to the data erased state. The read voltage VA may be 0V, and the threshold voltage of the memory cell transistor MT in the "Er" state is negative. The threshold voltage of the memory cell transistor MT in the "A" state is greater than or equal to the read voltage VA, and is smaller than the read voltage VB (>VA). The threshold voltage of the memory cell transistor MT in the "B" state is greater than or equal to the read voltage VB, and is smaller than the read voltage VC (>VB). The threshold voltage of the memory cell transistor MT in the "C" state is greater than or equal to the read voltage VC, and is smaller than the read voltage VD (>VC). The threshold voltage of the memory cell transistor MT in the "D" state is greater than or equal to the read voltage VD, and is smaller than the read voltage VE (>VD). The threshold voltage of the memory cell transistor MT in the "E" state is greater than or equal to the read voltage VE, and is smaller than the read voltage VF (>VE). The threshold voltage of the memory cell transistor MT in the "F" state is greater than or equal to the read voltage VF, and is smaller than the read voltage VG (>VF). The threshold voltage of the memory cell transistor MT in the "G" state is greater than or equal to the read voltage VG, and is smaller than the voltage VREAD. Of these eight states corresponding to the above-described threshold voltage distribution states, the "G" state indicates the highest threshold voltage distribution. The voltage VREAD is a voltage which is applied to non-selected word lines at the time of data reading and turns on any memory cell transistors MT coupled to the non-selected word lines regardless of the data stored in those memory cell transistors.

The above-described threshold voltage distribution states are realized by writing a 3-bit (3-page) value including the lower bit, middle bit, and upper bit in the corresponding memory cell transistor. The eight threshold voltage distribution states establish the following relationship with the lower bit, middle bit, and upper bit values.

"Er" state: "111" (in the order of "upper/middle/lower")
"A" state: "110"
"B" state: "100"
"C" state: "000"
"D" state: "010"
"E" state: "011"
"F" state: "001"
"G" state: "101"

In the above threshold voltage distribution states, the bit values of any adjacent two states have a difference in only one of the three bits.

In view of the above, when reading the value of the lower bit, the read voltages corresponding to the boundary voltages at which the value ("0" or "1") of the lower bit changes are used. The same applies to the middle bit and the upper bit.

1.2 Write Operation

A method of writing data into the NAND flash memory having the above-described configuration will be explained. In the method of programming data in the semiconductor memory device according to the present embodiment, the data of three pages as explained with reference to FIG. 9 is received, and the programming is executed based on this data, thereby directly changing the threshold voltage of the memory cell transistor MT from the "Er" state to a targeted threshold voltage. Hereinafter, such a method is referred to as a full sequence programming.

1.2.1 Writing Order

First, the selecting order of the string units SU0 to SU7 and word lines WL0 to WL7 when writing data into a certain block BLK is explained with reference to FIG. 10. FIG. 10 shows the selecting order, where the numerals "0" to "63" denote the places in the selecting order, which are indicated in cells identified by the numbers of the string units SU0 to SU7 in the top row and the numbers of the word lines WL0 to WL7 in the left column.

In the example of FIG. 10, a higher priority is assigned to the selection of a word line WL than the selection of a string unit SU. That is, the word line WL0 of the string unit SU0 is first selected, then the word line WL0 of the string unit SU1 is selected, and thereafter the word lines WL0 of the string unit SU2 to SU7 are selected in the same manner. After the word line WL0 of the last string unit SU7 is selected, the selection proceeds to the word line WL1. Then, the word lines WL1 of the string units SU0 to SU7 are sequentially selected. In this manner, For the word lines WL2 to WL7 in turn, the selection are performed in the same manner, and finally the word line WL7 of the string unit SU7 is selected.

1.2.2 Details of Write Operation

Figure 11:
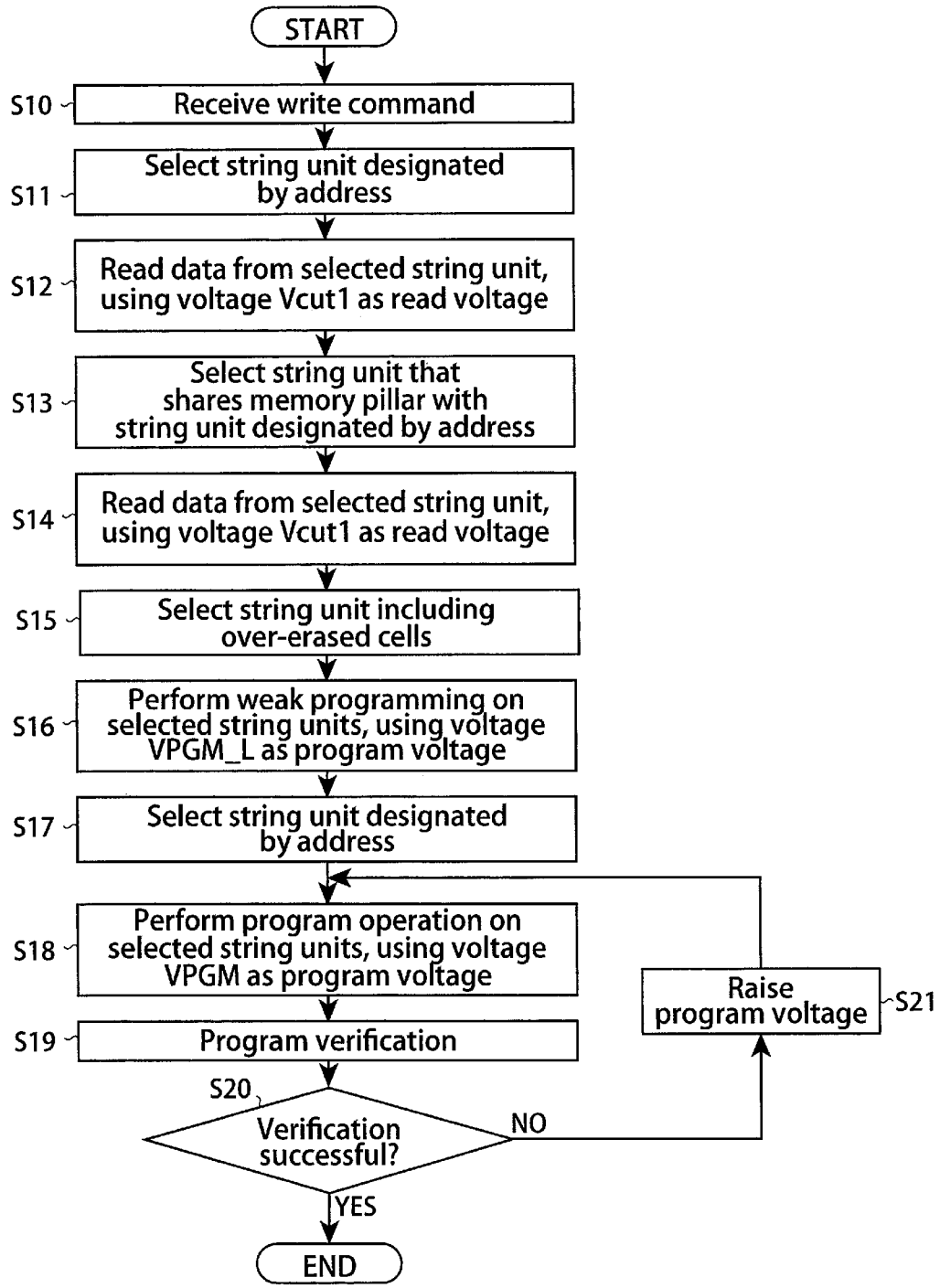
FIG. 11 shows a flowchart of a write operation of a semiconductor memory device according to the first embodiment.

Next, the write operation will be described in detail with reference to FIG. 11. FIG. 11 illustrates a flowchart of the write operation.

First, the NAND flash memory 100 receives a write command from the controller 200 (step S10). The write command is stored in the command register 160. An address sent together with the write command from the controller 200 is stored in the address register 150, and the write data is transferred to the sense amplifier 140. As described above, data of three pages is held in the sense amplifier 140.

Figure 12:
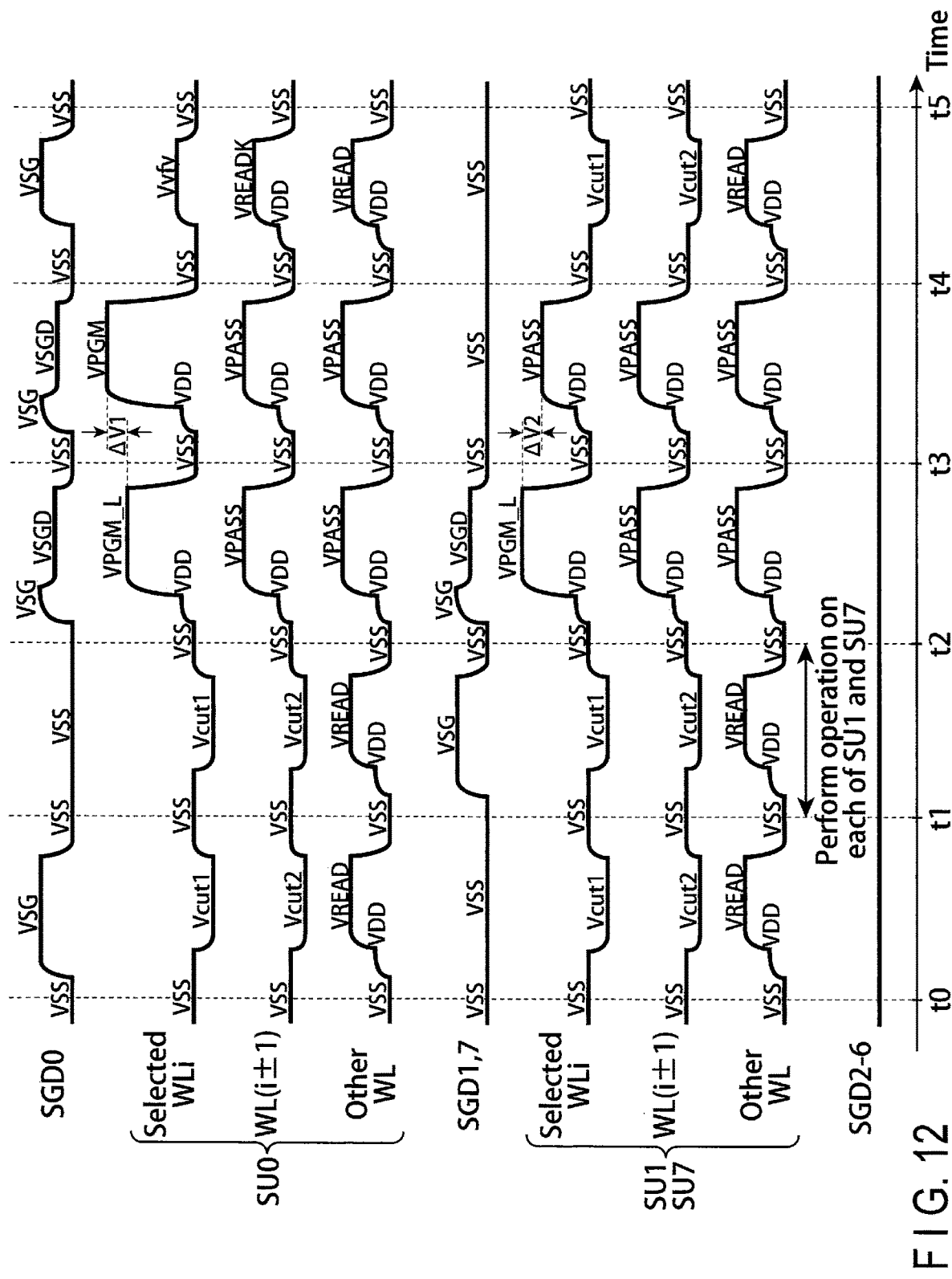
FIG. 12 shows a timing chart of transition of voltages of signal lines during a write operation in a semiconductor memory device according to the first embodiment.

With the write command stored in the command register 160, the sequencer 170 initiates the write operation. Roughly describing, the write operation includes three operations, namely, a pre-verify operation, a pre-program operation, and a data program operation. The operations are explained below with reference to the timing chart of FIG. 12, showing transition of voltages of the signal lines. In the example of FIG. 12, the word line WLi (where i is a variable between 0 and 7) of the string unit SU0 is designated by the controller 200.

First, the sequencer 170 performs the pre-verify operation.

<Pre-Verify Operation>

First, the sequencer 170 selects the string unit SU designated by the address that is received from the controller 200 (step S11). Then, the sequencer 170 reads data from the string unit SU selected at step S11. Here, the word line WL designated by the controller 200 is selected, and the voltage Vcut1 is applied to the selected word line WL as a read voltage (step S12).

Next, the sequencer 170 selects one or more other string units SU that shares any memory pillar MP with the string unit SU designated by the address that is received from the controller 200 (step S13). Then, the sequencer 170 reads the data from the one or more other string units SU selected at step S13. Again, the word line WL designated by the controller 200 is selected, and the voltage Vcut1 is applied to the selected word line WL as a read voltage (step S14). In a case where a plurality of string units SU share the memory pillars MP with the string unit SU designated by the address, steps S13 and S14 are performed for each of the plurality of string units SU.

The timing chart during the above-described steps S11 and S12 are shown between times t0 and t1 in FIG. 12. In this example, the controller 200 designates the word line WLi of the string unit SU0. The row decoder 120 applies a voltage VSG to the selection gate line SGD0 (and also to the selection gate line SGSe) corresponding to the string unit SU0. The voltage VSG turns on the selection transistors ST1 and ST2. The row decoder 120 further selects the word line WLi (WLei) and applies the voltage Vcut1 to the word line WLi. In addition, the row decoder 120 applies the voltage Vcut2 to the non-selected word lines WL(i±1) which are adjacent to the word line WLi, and applies the voltage VREAD to other non-selected word lines WL. The voltage Vcut2 may be a negative voltage, where the absolute value of Vcut2 is equal to and less than the absolute value of Vcut1, |Vcut1|≅|Vcut2|. The voltage VREAD has an amount of voltage enough to turn a memory cell transistor MT on, regardless of the data held in the memory cell transistor. The sense amplifier 140 pre-charges bit lines BL (BL0 to BL(L−1)). As a result, if a memory cell transistor MTi of the string unit SU0 is turned on, the memory cell transistor MTi passes a cell current from the corresponding bit line BL to the source line SL. The cell current can be detected by the sense amplifier 140. If a cell current flows through any of the bit lines BL, it indicates that the threshold value of the memory cell transistor MT coupled to the bit line and the word line WLi in the string unit SU0 is smaller than or equal to Vcut1. Hereinafter, such a memory cell transistor MT may be referred to as an "over-erased cell transistor".

Next, the states of the signal lines during steps S13 and S14 are shown between times t1 and t2 in FIG. 12. As illustrated in FIG. 12, the operations executed between times t0 and t1 are performed also for the string units SU1 and SU7. For instance, the row decoder 120 first applies the voltage VSG to the selection gate line SGD1 (and also to the selection gate line SGSo) corresponding to the string unit SU1, applies the voltage Vcut1 to the selected word line WLi (WLoi in this example), applies the voltage Vcut2 to the non-selected word lines WL(i±1) which are adjacent to the selected word line WLi, and applies the voltage VREAD to other non-selected word lines WL. The string unit SU1 shares the memory pillars MP0 and MP16 with the string unit SU0 (see FIG. 4). The memory pillars MP0 and MP16 are coupled to the bit lines BL0 and BL4 (see FIG. 3). That is, the string unit SU0 shares the memory pillars MP coupled to the bit line BL(4j) with the string unit SU1, where 4j denotes a multiplication of 4 and j, and j is an integer larger than or equal to zero. Thus, at the time of pre-verifying for the string unit SU1, the sense amplifier 140 pre-charges the bit lines BL(4j) coupled to those shared memory pillars MP, and senses the currents flowing through the bit lines BL(4j) or the voltages thereof, while the other bit lines BL(4j+1), BL(4j+2), and BL(4j+3) (i.e. BL1, BL2, BL3, BL5, BL6, . . . ) may be fixed to the voltage VSS. If the cell current flows from any one of the bit lines BL(4j) to the source line SL, it indicates that the threshold voltage value of at least one of the memory cell transistors MT coupled to the word line WLi (eg. conductive layer 11-1) and the one bit line BL(4j) in the string unit SU1 is smaller than or equal to Vcut1.

Similarly, the pre-verify operation is executed for the string unit SU7. The string unit SU7 has an only difference from the string unit SU1 in that the string unit SU7 shares the memory pillars MP (in the example of FIGS. 3 and 4, memory pillars MP7, MP14, MP15, MP23, MP30 and MP31) coupled to the bit lines BL(4j+1), BL(4j+2), and BL(4j+3) (in the example of FIGS. 3 and 4, bit lines BL1, BL2, BL3, BL5, BL6 and BL7), instead of the memory pillars MP(4j) coupled to the bit line BL(4j). These bit lines BL(4j+1), BL(4j+2) and BL(4j+3) are pre-charged. The rest of the operations are the same as the operations for the string unit SU1.

Next, the sequencer 170 performs the pre-program operation.

<Pre-Program Operation>

First, the sequencer 170 selects, from the string units SU selected at steps S11 and S13, one or more string units including at least one over-erased cell transistor (step S15). Then, the sequencer 170 executes the program operation for the one or more string units SU selected at step S15. In this operation, the word line WL designated by the controller 200 is selected, and the voltage VPGM_L is applied to the selected word line WL as a program voltage (step S16).

The states of the wiring lines during Steps S15 and S16 are shown between times t2 and t3 in FIG. 12. In this example, the string units SU0, SU1, and SU7 include over-erased cell transistors. The row decoder 120 applies the voltage VSG to the selection gate lines SGD0, SGD1, and SGD7 corresponding to the string units SU0, SU1, and SU7, and thereafter applies the voltage VSGD. The voltage VSGD has a lower voltage value than the voltage VSG. The voltage VSGD may turn the selection transistor ST1 on when 0V is applied to the bit line BL, and turn the selection transistor ST1 off when the voltage VSG is applied to the bit line BL. The row decoder 120 further applies the voltage VSS to the selection gate line SGS to turn the selection transistor ST2 off. Furthermore, the row decoder 120 selects the word lines WLi (WLei for the string unit SU0 and WLoi for the string units SU1 and SU7 in this example), applies the voltage VDD to these word lines WLi, and thereafter applies the voltage VPGM_L while applying the voltage VPASS to other non-selected word lines WL. The voltage VPGM_L has a lower voltage value than the program voltage VPGM used for the data programming, where the relationship VPGM>VPGM_L>VPASS>VSG>VDD is established. The sense amplifier 140 applies 0V to the one or more bit lines BL through which the cell current flows (i.e., the one or more bit lines to which at least one over-erased cell transistor is coupled) in the pre-verify operation at steps S11 to S15. On the other hand, a voltage VSG is applied to the one or more bit lines BL through which the cell current does not flow in the pre-verify operation. In the string units SU0, SU1 and SU7, since charge is injected into the charge accumulation layers of the memory cell transistors MTi of the NAND strings 50 corresponding to the one or more bit lines BL to which 0V is applied, the threshold voltage values of those memory cell transistors MTi are increased. Because the VPGM_L of a lower voltage value than the VPGM which is used for ordinary data programming is used, the shifts of the threshold values of those memory cell transistors MTi are smaller than in the ordinary data programming. The programming in the pre-programming operation is referred to as weak programming. In the NAND strings 50 corresponding to the one or more bit lines BL to which the voltage VSG is applied, the selection transistors ST1 are turned off. Thus, the weak programming is not applied to the memory cell transistors MTi of the string units SU0, SU1, and SU7 corresponding to these bit lines BL.

Next, the sequencer 170 performs the data program operation.

<Data Program Operation>

First, the sequencer 170 selects the string unit SU designated by the address that is received from the controller 200 (step S17). The other string units SU remain non-selected. Then, the sequencer 170 executes the program operation on the string unit SU selected at step S17. For this operation, the word line WL designated by the controller 200 is selected, and the voltage VPGM is used for a program voltage (step S18). The sequencer 170 performs the program verify operation (step S19). If the program verify operation fails (NO at step S20), the sequencer 170 increases a voltage value of the program voltage VPGM, and the process returns to step S18.

The states of the wiring lines during Steps S18 and S19 are shown between times t3 and t5 in FIG. 12. The program operation is executed between times t3 to t4, and the program verify operation is executed between times t4 to t5.

As shown in FIG. 12, the row decoder 120 applies the voltage VSG to the selection gate line SGD0 corresponding to the string unit SU0, and thereafter applies the voltage VSGD to the selection gate line SGD0. The row decoder 120 also applies the voltage VSS to the selection gate line SGS to turn the selection transistor ST2 of the string unit SU0 off. Furthermore, the row decoder 120 selects a designated word line WLi (WLei for the string unit SU0 in this example), applies the voltage VDD, and thereafter the voltage VPGM (=VPGML+ΔV1), to this word line WLi, while applying the voltage VPASS (=VPGM_L−ΔV2) to other non-selected word lines WL. The sense amplifier 140 applies 0V to the bit line BL0. In the string unit SU0, since charge is injected into the charge accumulation layer of the memory cell transistor MTi coupled to the selected word line WLi and the bit line BL0, the threshold voltage value of the memory cell transistor MTi is increased.

Furthermore, the row decoder 120 applies the voltage VSS to the selection gate lines SGD1 to SGD7 of the non-selected string units SU1 to SU7, thereby turning the selection transistors ST1 of the non-selected string units SU1 to SU7 off. The row decoder 120 further applies the voltage VPASS to the word lines WLi (i.e., WLoi) of the string units SU1 and SU7, and the voltage VPASS to other non-selected word lines WL.

Next, the program verify operation is executed between times t4 and t5. As shown between the times t4 and t5 in FIG. 12, the row decoder 120 applies the voltage VSG to the selection gate lines SGD0 and SGSe of the string unit SU0 to turn its selection transistors ST1 and ST2 on. The row decoder 120 selects the designated word line WLi (WLei for the string unit SU0 in this example), applies the program verify voltage Vvfy to this word line WLi, applies the voltage VREADK to the non-selected word lines WL(i±1) that are adjacent to the selected word line WLi, and applies the voltage VREAD to the other non-selected word lines WL, where the relationship Vvfy<VREAD≤VREADK may be established. The row decoder 120 further applies the voltage VSS to the selection gate lines SGD1 to SGD7 of the non-selected string unit SU1 to SU7 to turn their selection transistors ST1 off. The row decoder 120 applies the voltage Vcut1 to the word line WLi (i.e., WLoi) of the string units SU1 and SU7, applies the voltage Vcut2 to the non-selected word lines WL(i±1) (i.e., WLo(i±1) for the string units SU1 and SU7), and applies the voltage VREAD to the other non-selected word lines WLo. The sense amplifier 140 pre-charges the bit lines BL. If cell currents do not flow from the bit lines BL to the source line SL, the program operation passes the program verification, that is the data write operation was successful.

The data write operation is performed in the above-described manner. In the example of FIG. 12, with the string unit SU0 selected, two string units SU1 and SU7 which share the memory pillars MP with the string unit SU0 are targeted for the pre-verify operation and the pre-program operation. String units SU to be targeted for the pre-verify and pre-program operations, however, depend on which string unit SU is selected, as shown in FIG. 13. Further, the data writing or programming order as shown in FIG. 10 is also considered to select the target string units for the pre-verify and pre-program operations. It is because an already programmed string unit is not necessarily pre-verified for over-erased cell transistors even if the string unit shares any memory pillar with a write target string unit. The table of FIG. 13 shows string units SU to be targeted for the pre-verify and pre-program operations when writing data into each of the string units SU0 to SU7. In this table, "*1" indicates that the bit lines BL(4j) are pre-verified, and "*2" indicates that the bit lines BL(4j+1), BL(4j+2), and BL(4j+3) are pre-verified. No mark indicates that the bit lines BL(4j), BL(4j+1), BL(4j+2), and BL(4j+3) are pre-verified.

As explained in the example of FIG. 12, when writing data into the string unit SU0, the string units SU0, SU1, and SU7 are targeted for the pre-verify operation. Here, the bit lines BL to be targeted for the pre-verify operation are: all the bit lines BL for the string unit SU0; the bit line BL(4j) for the string unit SU1; and the bit lines BL(4j+1), BL(4j+2), and BL(4j+3) for the string unit SU7.

Similarly, when writing data into the string unit SU1, the string units SU1, and the string unit SU2 that shares memory pillars MP with the string unit SU1 are targeted for pre-verifying. As shown in FIGS. 3 and 4, in this example, the string unit SU1 also shares the memory pillars MP with the string unit SU0. However, as shown in FIG. 10, data is written in the string unit SU0 before writing data into the string unit SU1. Thus, the string unit SU0 does not require the pre-verifying operation for over-erased cell transistors. Targeted in the pre-verify operation are, for the string unit SU1, all the bit lines BL coupled to the string unit SU1, and for the string unit SU2, the bit lines BL(4j+1), BL(4j+2), and BL(4j+3) coupled to the memory pillars MP shared by the string unit SU1 and the string unit SU2.

Similarly, when writing data into the string unit SU2, according to the configuration of the string units SU illustrated in FIGS. 3 and 4 and the table of the data writing order illustrated in FIG. 10, the string units SU2 and the string unit SU3 sharing memory pillars MP with the string unit SU2 are targeted for pre-verifying. All the bit lines BL of the string unit SU2 are pre-verify targets, while the bit lines BL(4j) coupled to the shared memory pillars are a pre-verify target for the string unit SU3.

The pre-verify operations are executed in the same manner when writing data into the string units SU3 to SU6. When writing data into the string unit SU7, according to the data writing order shown in FIG. 10, the pre-verify and pre-program operations and the data write operation for the adjacent string units SU6 and SU0 are already completed. Thus, only the string unit SU7 is targeted for pre-verifying.

As a result of the pre-verify operation, the bit lines BL corresponding to the over-erased cell transistors are selected so that the pre-program can be executed for the over-erased cell transistors.

1.3 Effects According to First Embodiment

According to the first embodiment, reliability in the operation of the semiconductor memory device can be enhanced. The effects are discussed in detail below.

With the method of writing data into the semiconductor memory device according to the present embodiment, a pre-verify operation is executed before data programming. In particular, the verify operation is executed on a memory cell transistor into which data is to be written (referred to as a selected cell) and a non-selected memory cell transistor (hereinafter referred to as a backside cell transistor) that is arranged on the same layer of the same memory pillar MP as the selected cell, as shown in FIGS. 6 and 7. Whether the threshold voltage value of the backside cell transistor is smaller than or equal to the voltage Vcut1 is thereby checked. When the threshold voltage value of the backside cell transistor is smaller than or equal to the voltage Vcut1 (i.e. with the backside cell transistor being an over-erased cell transistor), the pre-program operation is executed so that the threshold voltage value of the backside cell transistor is increased to a value larger than the voltage Vcut1.

In this manner, in the program verify operation, the memory cell transistors MT0 to MT7 of the non-selected string unit SU can be in an off state. Thus, in the program verify operation, the reliability of the verify result of the memory cell transistor MT based on the on/off state when the voltage Vvfy is applied to its control gate can be improved.

In the structure of the memory pillar MP illustrated in FIGS. 6 and 7, two memory cell transistors MT (a selected cell transistor and a backside cell transistor) that face each other across a memory pillar MP or are positioned on the opposite sides of the memory pillar MP share the semiconductor layer 31 of the memory pillar MP. Thus, when one of the two facing memory cell transistors MT is turned on, a cell current flows through the turned-on memory cell transistor. In order to execute the program verify operation for the selected cell, the voltage Vcut1 is applied to the selected cell transistor. If the selected sell transistor is properly programmed so that the threshold voltage value of the selected cell transistor is sufficiently increased, the cell current does not flow through the selected cell transistor. However, the voltage Vcut1 is also applied to the control gate of the backside cell transistor during the program verify operation. If the threshold value of the backside cell transistor is smaller than or equal to the Vcut1 (i.e. with the backside cell being an over-erased cell transistor), the cell current may still flow through the backside cell transistor even after the threshold voltage value of the selected cell is sufficiently increased, as a result of which the program verify operation ends in failure.

According to the present embodiment, the backside cell transistor can securely be in the off state during the verify operation so that the cell current can be prevented from flowing through this backside cell transistor. As a result, whether a cell current flows or not is determined in accordance with whether a selected cell is in the ON state or OFF state when the voltage Vvfy is applied, or in other words, in accordance with whether the threshold voltage value of the selected cell is smaller than or equal to the voltage Vvfy, or larger than the voltage Vvfy. In this manner, the adverse influence of the backside cell transistor can be reduced.

In the example of FIG. 11, the pre-program operation is executed after the pre-verify operation. However, in case where no over-erased cell transistor is found as a result of steps S12 and S14, the pre-program operation at steps S15 and S16 may be omitted.

2. Second Embodiment

A semiconductor memory device according to a second embodiment will be explained. A method of writing data into a semiconductor memory device which is different from the first embodiment is adopted in the second embodiment. In particular, the absence of an over-erased cell transistor is determined after the pre-program operation is performed according to the first embodiment, and then, the data program operation in step S17 and subsequent steps is executed.

In the following description, only the differences with respect to the first embodiment will be explained.

2.1 Data Write Method

Figure 14:
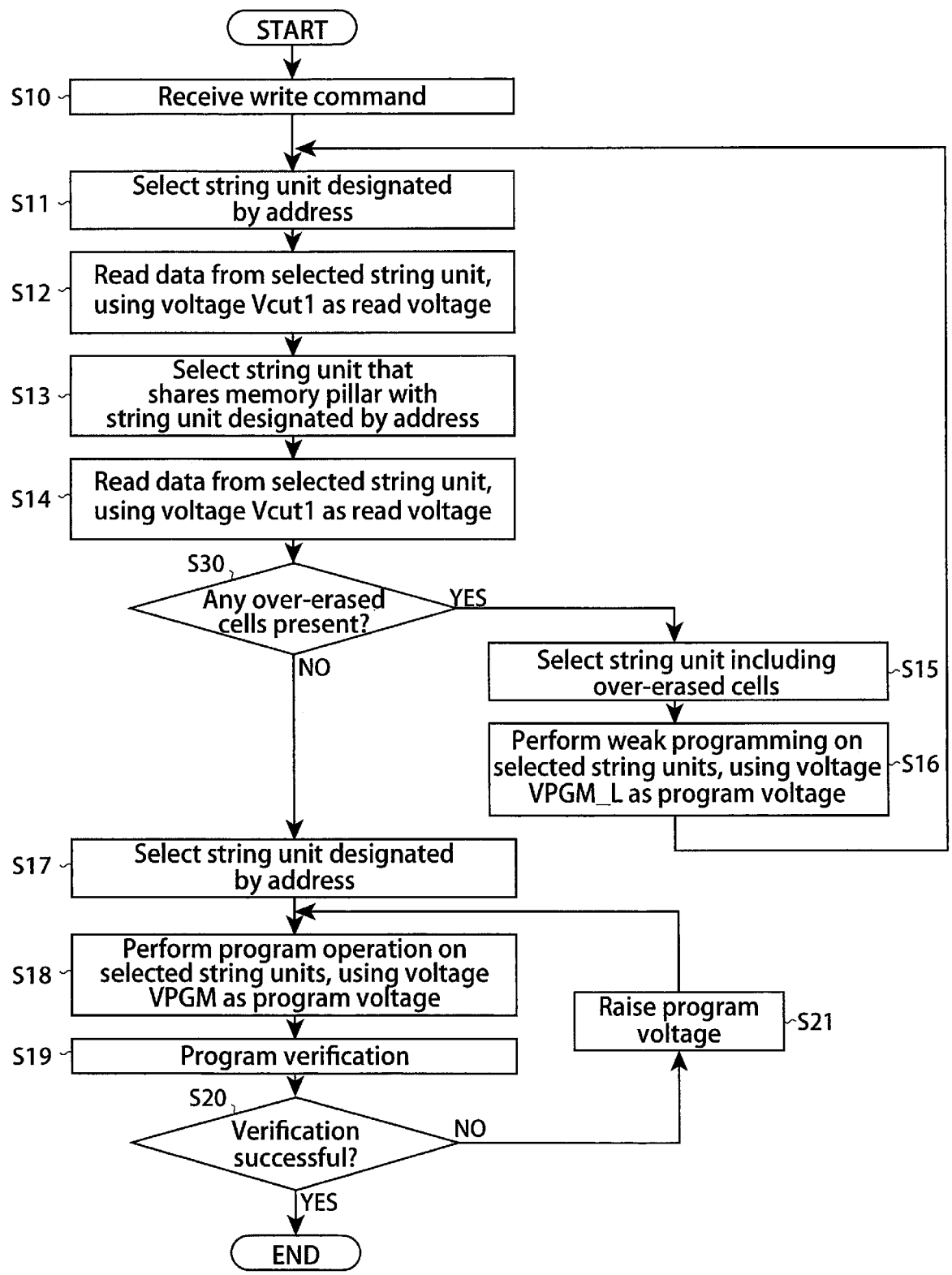
FIG. 14 shows a flowchart of a data write operation in a semiconductor memory device according to a second embodiment.

FIG. 14 shows a flowchart of the write operation in a semiconductor memory device according to the present embodiment. As illustrated here, what is different from the first embodiment in FIG. 11 is that, after pre-verifying at steps S11 to S14, pre-programming is executed at steps S15 to S16 when a string unit including an over-erased cell transistor is found. In particular, whether or not the threshold value of the memory cell transistor MTi is higher than Vcut1 is determined at steps S11 to S14, and pre-programming is executed at steps S15 to S16 if the presence of any over-erased cell transistor is observed (YES at step S30). Thereafter, whether or not the threshold value of the memory cell transistor MTi becomes higher than Vcut1 is checked again at steps S11 to S14, and if the presence of any over-erased cell transistor is still observed (YES at step S30), steps S15 to S16 and S11 to S14 are repeated. When an over-erased cell is no longer found (or when the number of over-erased cells falls below a predetermined number), the operation proceeds to steps S17 to S21 to execute the data program operation. Thus, the presence of any over-erased cell transistors are checked again after the pre-program operation is performed at steps S15 and S16.

FIG. 15 shows a timing chart of the transition of voltages of the signal lines during the data write operation according to the second embodiment, which corresponds to FIG. 12 illustrating the timing chart during the data write operation according to the first embodiment. FIG. 12 illustrates a situation in which an over-erased cell is found at step S30 after the first pre-verify operation is performed. As illustrated in FIG. 15, after the pre-program operation is executed during times t2 to t3', the pre-verify operation is again executed for the string unit SU0 during times t3' to t3". This pre-verify operation is the same as the pre-verify operation executed during times t0 to t1. Thereafter, during the times t3" to t3, the pre-verify operation is executed for each of the string units SU1 and SU7. This pre-verify operation is the same as the pre-verify operation executed during times t1 to t2, and the operation is independently executed for the string units SU1 and SU7. In particular, first, the pre-verify operation begins with selection of the selection gate line SGD1 while not selecting the other selection gate lines SGD to pre-verify the string unit SU1. Then, the pre-verify operation is executed for the string unit SU7 by selecting the selection gate line SGD7, while not selecting the other selection gate lines SGD.

The memory cell transistors MT for which it is pre-verified that they are no longer over-erased cell transistors after pre-programming at steps S15 and S16 will not be subjected to the next pre-programming, and the voltage VSG may be applied to the bit lines BL corresponding to those memory cell transistors MT.

2.2 Effects According to Second Embodiment

According to the second embodiment, it is confirmed that the threshold voltages of memory cell transistors MTi in the erased state are higher than the voltage Vcut1 by pre-verifying the memory cell transistors MTi after pre-programming. After it is confirmed, the data program operation is executed. Thus, the reliability of the data write operation can be enhanced.

3. Third Embodiment

Next, a semiconductor memory device according to a third embodiment will be discussed. In the third embodiment, a method of writing data into the semiconductor memory device that is different from the first and second embodiments is adopted. In particular, the program operation is executed for memory cell transistors targeted for the data write operation before the pre-verify operation as discussed according to the first and second embodiments. In the following explanation, only differences with respect to the first and second embodiments will be discussed.

3.1 Data Write Method

Figure 16:
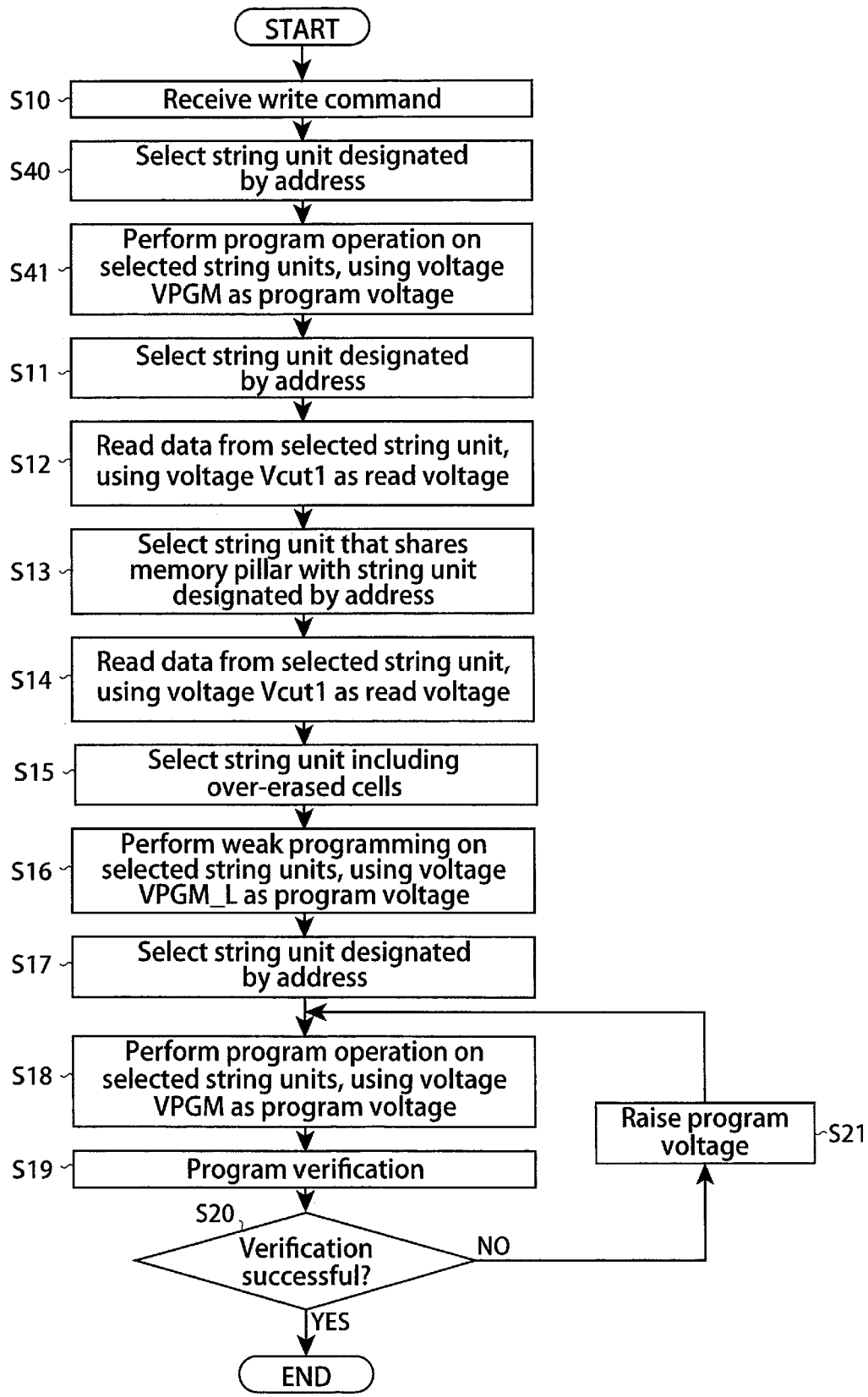
FIG. 16 shows a flowchart of a write operation in a semiconductor memory device according to a third embodiment.

FIG. 16 shows a flowchart of the data write operation in a semiconductor memory device according to the third embodiment. As shown in this flowchart, the write operation differs from FIG. 11 of the first embodiment in that upon receipt of a write command at step S10, the program operation is executed for a string unit SU designated by the address that is received from the controller 200, before executing the pre-verify operation at steps S11 to S14. In detail, the sequencer 170 selects the string unit SU designated by the address that is received from the controller 200 (step S40). Then, the sequencer 170 executes the program operation for the string unit SU selected at step S40. In this operation, the word line WLi designated by the controller 200 is selected, and a voltage VPGM is applied to the selected word line WLi as a program voltage (step S41). Then, the operations of step S11 and subsequent steps as discussed in the first embodiment are executed.

FIG. 16 illustrates the data write operation in which the operation of the third embodiment is applied to the data write operation according to the first embodiment as shown in FIG. 11. However, the operation of the third embodiment may also be applied to the data write operation of the second embodiment. In this case, the operation of the third embodiment may include performing steps S40 and S41 after step S10 and before step S11 as shown in FIG. 14 while step S11 is executed after step S16.

Figure 17:
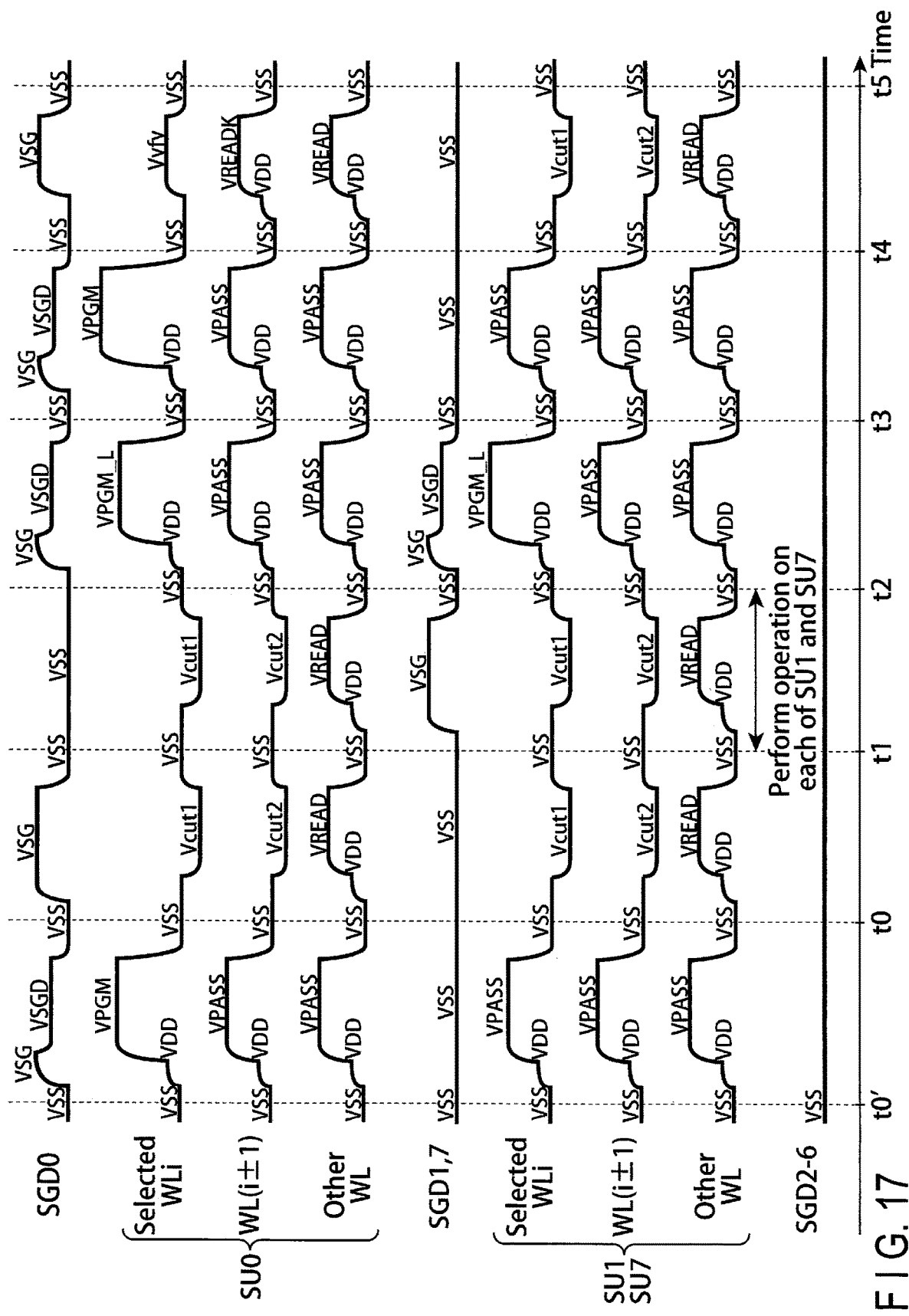
FIG. 17 shows a timing chart of the transition of voltages of signal lines during a write operation in a semiconductor memory device according to the third embodiment.

FIG. 17 shows a timing chart of the voltages of the signal lines during the data write operation in a semiconductor memory device according to the third embodiment, which corresponds to the timing chart according to the first embodiment as shown in FIG. 12. As illustrated in FIG. 17, the program operation is executed during times t0' to t0 before time t0. This program operation is the same as the program operation executed during times t3 and t4. In the program operation executed during times t0' to t0 as shown in of FIG. 17, however, all the bit lines BL are targeted for the write operation. Therefore, the sense amplifier 140 applies, for example, 0V to all the bit lines BL.

3.2 Effects According to Third Embodiment

According to the third embodiment, the program operation is executed on the selected memory cell transistors before the pre-verify operation is performed. In this manner, the threshold values of the selected memory cell transistors can be set higher than the voltage Vcut1. In the example shown in FIG. 17, a single program pulse is applied during the times t0' to t0. However, multiple program pulses may be applied during the times t0' to t0.

4. Fourth Embodiment

A semiconductor memory device according to the fourth embodiment will be explained. In the fourth embodiment, a writing order different from the writing order in the semiconductor memory device according to the first embodiment is adopted so that the number of pre-verify operations and pre-program operations can be reduced. In the following explanation, only differences with respect to the first embodiment will be discussed.

4.1 Writing Order

FIG. 18 a data writing (selection) order for the string units SU0 to SU7 and the word lines WL0 to WL7 when writing data into a certain block BLK of the semiconductor memory device.

In this example, as shown in FIG. 18, like FIG. 10 referred to in the explanation of the first embodiment, a higher priority is assigned to the selection of a word line WL than the selection of a string unit SU. However, the writing order of FIG. 18 differs from FIG. 10 in that a higher priority is assigned to even string units SUe than odd string units SUo.

In particular, first, the word line WL0 of the string unit SU0 is selected, then the word line WL0 of the string unit SU2 is selected, and then, similarly, the word lines WL0 of the string units SU4 and SU6 are selected. Thereafter, the word lines WL0 of the odd string units SUo are selected in turn. That is, the word line WL0 of the string unit SU1 is selected, the word line WL0 of the string unit SU3 is selected, and then the word lines WL0 of the string units SU5 and SU7 are selected in a similar manner. Thereafter, the word line WL1 is selected. The selection of the word line WL1 is performed in a similar manner, for each of the string units SU0, SU2, SU4, SU6, SU1, SU3, SU5, and SU7 selected in this order. Finally in this sequence of selection of the string unit SU and the word line WL for writing data, the word line WL7 of the string unit SU7 is selected.

4.2 Data Write Method

FIG. 19 shows a flowchart of the data write operation in the semiconductor memory device according to the fourth embodiment. As shown in the flowchart of FIG. 19, the fourth embodiment differs from the flowchart of FIG. 11 according to the first embodiment in that, after step S10, the sequencer 170 determines whether a string unit SU designated by the address received from the controller 200 is an even string unit or an odd string unit. If the designated string unit SU is an even string unit (YES at step S51), the sequencer 170 executes the operations in step S11 and subsequent steps, as explained in the first embodiment. On the other hand, if it is an odd string unit (NO at step S51), the sequencer 170 executes the data program operation in steps S17 to S21 by skipping steps S11 to S16.

FIG. 20 shows string units SU targeted for the pre-verify and pre-program operations when writing data into the even string units SU0, SU2, SU4, and SU6. In the same manner as the first embodiment discussed with reference to FIG. 13, "*1" in this table indicates that the bit lines BL(4$j$) are pre-verified, "*2" indicates that the bit lines BL(4$j$+1), BL(4$j$+2), and BL(4$j$+3) are pre-verified. No mark indicates that the bit lines BL(4$j$), BL(4$j$+1), BL(4$j$+2), and BL(4$j$+3) are pre-verified.

When writing data into the string unit SU0, the string units SU0, SU1, and SU7 are targeted for the pre-verify operation. All the bit lines BL of the string unit SU0 are pre-verified; the bit lines BL(4$j$) of the string unit SU1 are pre-verified; and the bit lines BL(4$j$+1), BL(4$j$+2), and BL(4j+3) of the string unit SU7 are pre-verified, which is like the first embodiment as discussed with reference to FIG. 13.

When writing data into the string unit SU2, the string unit SU1, in addition to the string units SU2 and SU3, is also pre-verified. For the string unit SU1, the bit lines BL(4j+1), BL(4j+2), and BL(4j+3) are pre-verified. The string unit SU1 should be pre-verified because, as shown in FIGS. 3 and 4, the string unit SU2 is positioned adjacent to the string unit SU1 so that the string unit SU2 shares the memory pillars MP (i.e. MP1, MP8, MP9, MP17, MP24 and MP25) with the string unit SU1, and when writing to the string unit SU2, no writing or programming is yet to be performed for the memory cell transistors MT of the string unit SU1. In the example of FIGS. 3 and 4, the memory pillars MP shared by the string units SU1 and SU2 are memory pillars MP1, MP8, MP9, MP17, MP24 and MP25, to which the bit lines BL1 to BL3 and BL5 to BL7 are coupled. Thus, for the string unit SU1, the bit lines BL1 to BL3 and BL5 to BL7 represented by BL(4j+1), BL(4j+2), and BL(4j+3) are pre-verified.

Similarly, when writing data into the string unit SU4, the string units SU3, SU4 and SU5 are pre-verified. For the string unit SU3, the bit lines BL(4j+1), BL(4j+2) and BL(4j+3) are pre-verified depending on the memory pillars MP shared with the string unit SU4. Furthermore, when writing data into the string unit SU6, the string units SU5, SU6, and SU7 are pre-verified. For the string unit SU5, the bit lines BL(4j+1), BL(4j+2), and BL(4j+3) are pre-verified.

When writing data into the odd string units SU1, SU3, SU5, and SU7, the data writing or programming for the even string units SU0, SU2, SU4, and SU6 has been completed as shown in FIG. 18. Thus, neither pre-verifying nor pre-programming is required to write data into the odd string units SU1, SU3, SU5, and SU7.

A writing order is not limited to the writing order of FIG. 18. Data may be written into the even string units SU0, SU2, SU4, and SU6 after writing data into the odd string units SU1, SU3, SU5, and SU7.

4.3 Effects According Fourth Embodiment

According to the fourth embodiment, by optimally setting the writing order, the pre-verify operation and pre-program operation can be executed only either for the even string units or for the odd string units. Thus, the processing speed of the write operation can be increased.

The determination at steps S50 and S51 of FIG. 19 may be performed by the NAND flash memory 100. Whether the designated string unit is even or odd may also be designated by a command from the controller 200. For the case of designating it by the command, a command sequence transmitted from the controller 200 to the NAND flash memory 100 is shown FIG. 21.

As shown in FIG. 21, the controller 200 first transmits lower page data to the NAND flash memory 100. Such a command sequence includes:

<XXh><01h><80h><CA1><CA2><RA1><RA2><RA3><DATA><1Xh>

The "XXh" is a prefix command indicating that the NAND flash memory 100 is instructed to execute a pre-verify operation and a pre-program operation for an even string unit which is a data write target. The "01h" indicates that a lower page data is sent, and the "80h" is used to declare that an address input will follow. After column address and row address are transmitted over five cycles, the lower page data is transmitted. Finally, the "1Xh" command is transmitted. The "1Xh" is a command for instructing the NAND flash memory 100 so that the inside registers receive the transmitted data. Upon reception of this command "1Xh", the NAND flash memory 100 goes into a busy state, and the lower page data is transferred to the sense amplifier 140. Thereafter, when the NAND flash memory 100 returns to a ready state, the controller 200 transmits the middle page data to the NAND flash memory 100. This command sequence includes:

<02h><80h><CA1><CA2><RA1><RA2><RA3><DATA><1Xh>

The "02h" indicates that a middle page data is sent. When the "1Xh" command is transmitted to the NAND flash memory 100, the NAND flash memory 100 goes into a busy state, and the middle page data is transferred to the sense amplifier 140. Thereafter, when the NAND flash memory 100 returns to a ready state, the controller 200 transmits the upper page data to the NAND flash memory 100. This command sequence includes:

<03h><80h><CA1><CA2><RA1><RA2><RA3><DATA><10h>

The "03h" indicates that an upper page data is sent. When the "10h" command is transmitted to the NAND flash memory 100, the NAND flash memory 100 goes into a busy state, and the upper page data is transferred to the sense amplifier 140. In the NAND flash memory 100, the transferred 3-page data is written into the memory cell array 110. That is, in response to reception of the "10h" command, the NAND flash memory 100 goes from the ready state into the busy state, and the pre-verify operation and pre-program operation are executed for the even string unit designated by the address. Then, the data program operation is executed, and thereafter the NAND flash memory 100 returns from the busy state to the ready state. On the other hand, when an odd string unit is designated by an address as the data write target, after the NAND flash memory 100 goes into the busy state, the data program operation is executed without executing the pre-verify and pre-program operations. Thereafter, the NAND flash memory 100 returns to the ready state.

As discussed above, whether or not to execute the pre-verify and pre-program operations may be determined in accordance with the command of the controller 200.

Furthermore, a writing order is not limited to the writing order shown in FIG. 18, and may be the writing order as indicated in FIG. 22. As shown in FIG. 22, first, data may be written for the word lines WL0 to WL7 in each of the even string units SU0, SU2, SU4, and SU6, and thereafter, for the word lines WL0 to WL7 in each of the odd string units SU1, SU3, SU5, and SU7. The same effects can be achieved with this writing order.

5. Fifth Embodiment

Next, a semiconductor memory device according to the fifth embodiment will be explained. According to the fifth embodiment, a two-stage data writing scheme is applied to the semiconductor memory device of the first to fourth embodiments. Such a scheme is referred to as "2-stage programming". The following explanation focuses only on differences of the fifth embodiment with respect to the first to fourth embodiments.

5.1 2-Stage Programming

First, the 2-stage programming according to the present embodiment will be explained by citing two examples.

1st Example

Figure 23:
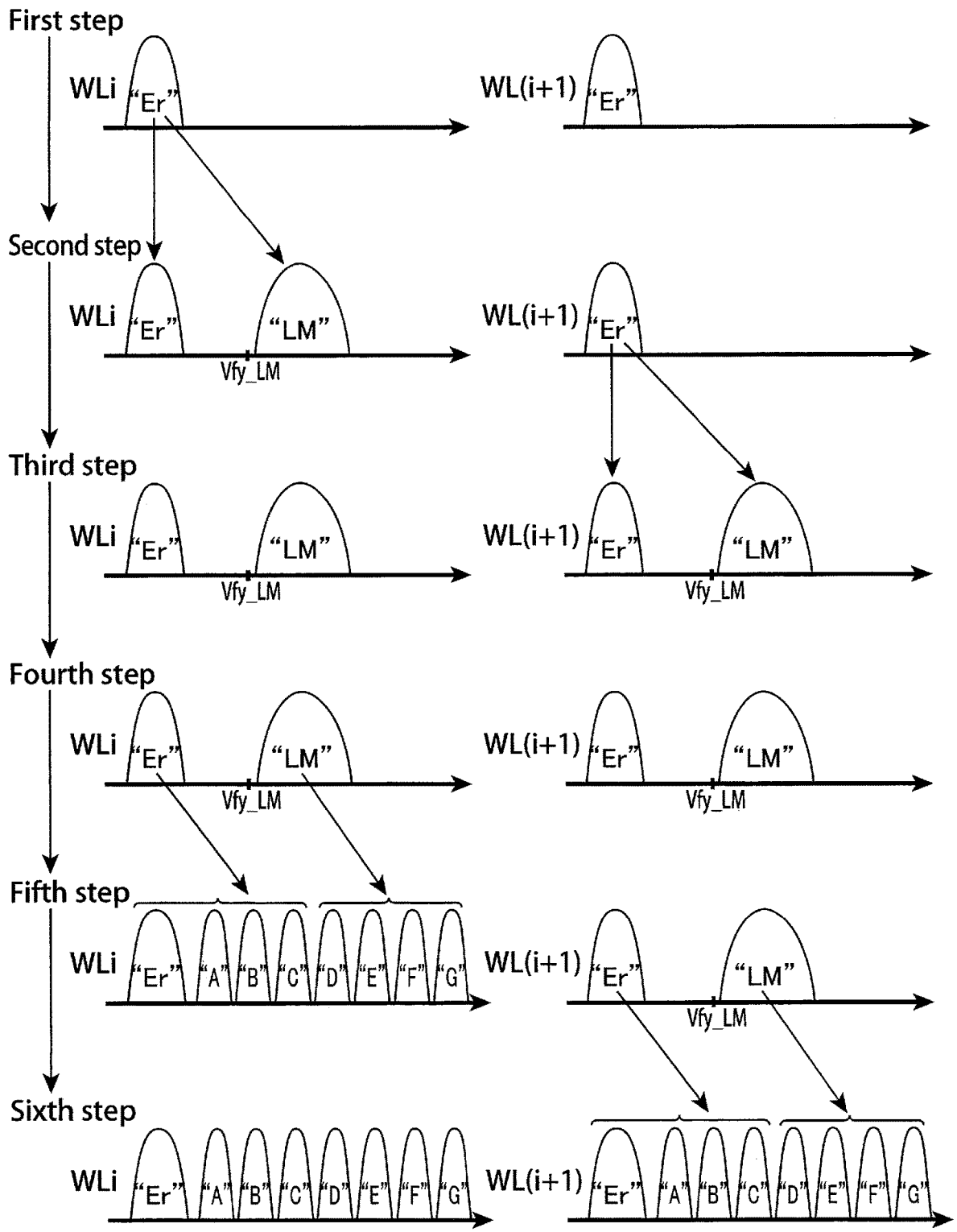
FIGS. 23 and 24 show the threshold voltage transition during a data write operation for memory cells in a semiconductor memory device according to a fifth embodiment.

FIG. 23 shows respective steps performed for writing data into memory cell transistors MT coupled to word lines WLi and WL(i+1) in the 2-stage programming according to 1st Example by illustrating the threshold voltage distributions of the memory cell transistors MT.

As shown in FIG. 23, at the first step, both the memory cell transistors MT coupled to the word lines WLi and WL(i+1) are in the "Er" state. In this "Er" state, the word line WLi is selected to execute the program operation for the memory cell transistor MT to be set to any of the "D" to "G" states. The verify voltage level used for this programming has a middle level voltage Vfy_LM which is lower than the target threshold voltage value. As a result, as shown in the second step, the threshold voltage of the memory cell transistor MT coupled to the word line WLi is arranged in a middle-level distribution, which is referred to as an "LM" state. The "LM" state may range from the "D" state to the "G" state. The program operation for the "LM" state is referred to as first stage programming.

Next, as shown in the third step, the word line WL(i+1) positioned adjacent to the word line WLi on its drain side is selected, and the first stage programming is executed for the memory cell transistor MT coupled to the word line WL(i+1). Due to this first stage programming for the word line WL(i+1), the memory cell transistor MT coupled to the word line WLi is affected by the inter-cell interference effect, and its threshold voltage distribution is shifted toward the positive voltage side.

Thereafter, as shown in the fourth step, the word line WLi is selected to write data. The verify voltage level is set to the target verify voltage level. In this program operation, the "A", "B", or "C" state can be made from the "Er" state, and the "D", "E", "F", or "G" state from the "LM" state. This program operation is referred to as second stage programming. Since the transition of the threshold voltage of the memory cell transistor MT in the second stage programming is smaller than for the full sequence programming, the amount of the threshold voltage value shift for the memory cell transistor MT in the fourth step can be reduced.

Next, as shown in the fifth step, the word line WL(i+1) is selected to execute the second stage programming is executed for the memory cell transistor MT coupled to the word line WL(i+1). When executing the second stage programming for the word line WL(i+1), the first stage programming for the word line WL(i+2) is already completed.

Thus, as shown in the sixth step, in the 2-stage programming of the 1st Example, the inter-cell interference effect may be reduced.

2nd Example

Figure 24:
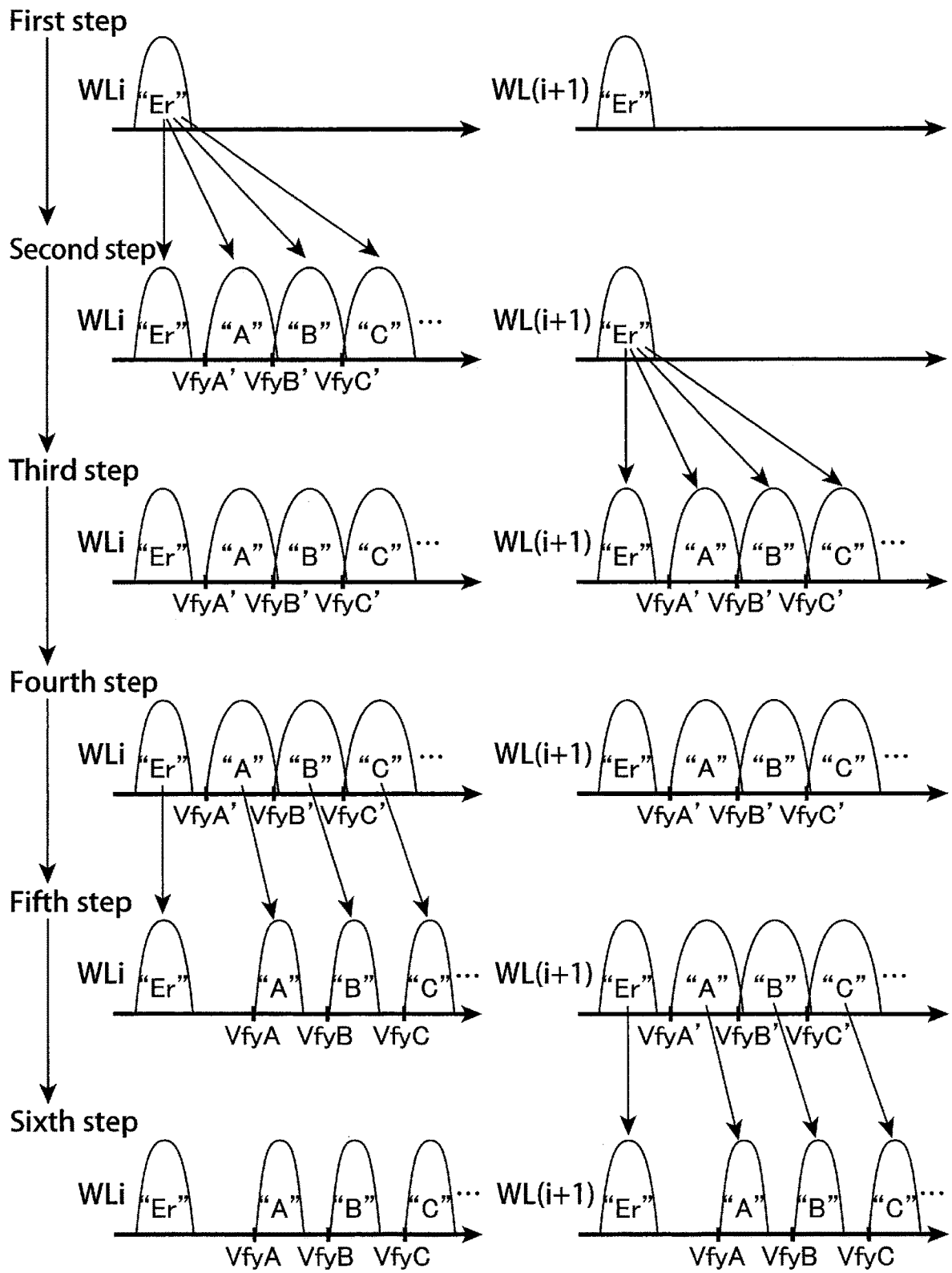

The 2-stage programming according to 2nd Example is explained. FIG. 24 shows respective steps performed for writing data into the memory cell transistors MT coupled to the word lines WLi and WL(i+1) in the 2-stage programming according to the 2nd Example by illustrating the threshold distributions of the memory cell transistors MT.

As shown in FIG. 24, at the first step, both the memory cell transistors MT coupled to the word lines WLi and WL(i+1) are in the "Er" state. In this state, the word line WLi is selected to write data into the memory cell transistor MT coupled to the word line WLi. The verify voltages adopted here are set to the voltage levels VfyA', VfyB', VfyC', ..., which are lower than the target verify voltage levels VfyA, VfyB, VfyC, ..., respectively. As a result, as shown in the second step, the threshold voltage of the memory cell transistor MT coupled to the word line WLi is temporarily set in the foggy threshold voltage distribution of the "A", "B", "C", ... states. This is referred to as first stage programming of the 2nd Example.

Next, as indicated at the third step, the word line WL(i+1) is selected to execute the first stage programming for the memory cell transistor MT coupled to the word line WL(i+1) in a similar manner. With this first stage programming for the word line WL(i+1), the memory cell transistor MT coupled to the word line WLi is affected by the inter-cell interference effect, and its threshold distribution is shifted toward the positive voltage side.

Thereafter, as indicated in the fourth step, the word line WLi is selected to write data. The verify voltages adopted here are set to target verify voltage levels VfyA, VfyB, VfyC, .... Since the threshold voltage of the memory cell transistor MT coupled to the word line WLi is programmed in the foggy threshold voltage distribution corresponding to any of the "A" state, "B" state, "C" state, ..., the amount of the threshold voltage shift at the fourth step can be reduced. This programming is referred to as second stage programming of the 2nd Example.

Next, as indicated in the fifth step, the word line WL(i+1) is selected to execute the second stage programming for the memory cell transistor MT coupled to the word line WL(i+1). In the 2nd Example, at the time of executing the second stage programming for the word line WL(i+1), the first stage programming for the word line WL(i+2) is already completed.

As a result, as indicated in the sixth step, in the 2-stage programming of the 2nd Example, the inter-cell interference effect can be reduced.

5.2 Writing Order

FIG. 25 shows a writing order with respect to the string units SU0 to SU7 and the word lines WL0 to WL7 (i.e. a selection order thereof) when writing data into a certain block BLK. In FIG. 25, "1st" and "2nd" denote execution of the first and second stage programming, respectively. FIG. 25 shows the writing order for the first stage programming and the second stage programming.

As shown in FIG. 25, a higher priority is assigned to the selection of a word line WL than the selection of a string unit SU in this example, in the same manner as the first embodiment illustrated in FIG. 10. This example, however, differs from FIG. 10 in that, firstly, the first stage programming for the word line WL0 of the string units SU0 to SU7 is executed, and secondly, the first stage programming for the word line WL1 of the string units SU0 to SU7 is executed in a similar manner, and thereafter the second stage programming for the word line WL0 of the string units SU0 to SU7 is executed.

In other words, with a certain word line WL selected, the string units SU0 to SU7 are selected in turn. The second stage programming for the word line WLi of a certain string unit SU is executed after the first stage programming for the word line WL(i+1) of this string unit SU is completed. This writing order as well as the various writing orders discussed below is applied to all the 2-stage programming schemes.

5.3 Method of Writing Data

Figure 26:
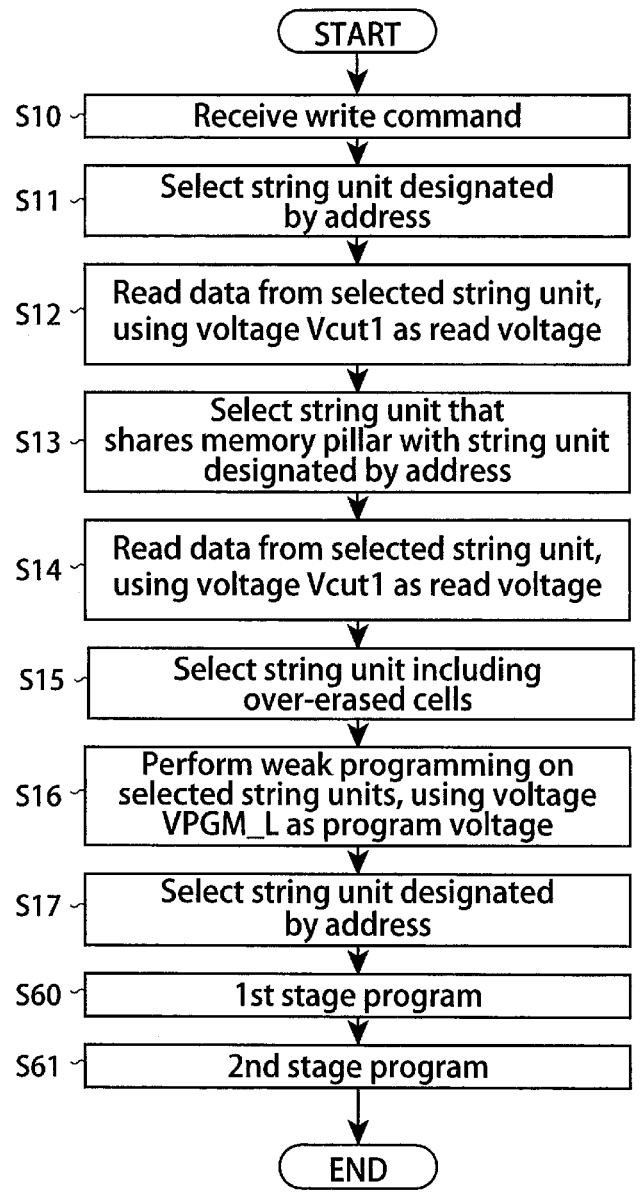
FIG. 26 shows a flowchart of a write operation in a semiconductor memory device according to the fifth embodiment.

FIG. 26 shows a flowchart of the write operation according to the fifth embodiment. As shown in FIG. 26, steps S10 to S17 are performed in the same manner as in the first embodiment discussed with reference to FIG. 11. Thereafter, the first stage programming is executed for word line WLi of the string units SU0 to SU7 (step S60). When the first stage programming is completed for the word lines WL(i+1) of the string units SU0 to SU7, the second stage programming is executed for the word line WLi of the string units SU0 to SU7 (step S61). The detailed operations of both the first stage programming and the second stage programming are the same as the operations performed during times t3 to t5 as explained in the first embodiment with reference to FIG. 12, except for the verify voltages adopted.

The data write operation is executed in the above-described manner. As shown in FIG. 27, the pre-verify operation and the pre-program operation are executed in the first stage programming, but are not executed in the second stage programming. This scheme is illustrated in FIG. 27 which shows the string units SU targeted for the pre-verify and pre-program operations at the time of executing the first stage program and the second stage program when writing data into each of the string units SU0 to SU7. In FIG. 27, like FIG. 13 of the first embodiment, "*1" indicates that the bit lines BL(4j) are pre-verified, "*2" indicates that the bit lines BL(4j+1), BL(4j+2), and BL(4j+3) are pre-verified. No mark represents the bit lines BL(4j), BL(4j+1), BL(4j+2), and BL(4j+3) are pre-verified.

As shown in FIG. 27, the string units SU targeted for the pre-verify operation and the pre-program operation at the time of executing the first stage programming are the same as the string units SU targeted in the first embodiment explained with reference to FIG. 13, for the same reason as the first embodiment. In contrast, at the time of executing the second stage programming, neither pre-verify operation nor pre-program operation is executed. This is because at the time of the second stage program, the first stage programming for the adjacent string units SU that share the memory pillars MP with the write target string unit SU is already completed, and therefore the possibility of the backside cells on the shared memory pillars MP being an over-erased cell is low.

5.4 Effects According to Fifth Embodiment

As discussed above, the write method explained in the first embodiment is applicable to the 2-stage programming. Alternatively, one of the second to fourth embodiments may be applied.

6. Sixth Embodiment

Next, a semiconductor memory device according to the sixth embodiment will be explained. This embodiment relates to the modification examples of the writing order as described in the fifth embodiment. The following discussion will focus on differences of the sixth embodiment with respect to the fifth embodiment.

6.1 1st Example

FIG. 28 shows another writing order with respect to the string units SU0 to SU7 and the word lines WL0 to WL7 (i.e. another selection order thereof) according to 1st Example.

In the order according to this example, the higher priority is assigned to the selection of word lines WL in the same manner as in the fifth embodiment, and for the string units SU, the higher priority is assigned to the selection of even string units SUe than odd string units SUo.

In the 1st Example, first, the string units SU0, SU2, SU4, and SU6 are selected for the word line WL0 to execute the first stage programming, and then the string units SU1, SU3, SU5, and SU7 are selected to execute the first stage programming. Next, the string units SU0, SU2, SU4, and SU6 are selected for the word line WL1 to execute the first stage programming, and then the string units SU1, SU3, SU5, and SU7 are selected to execute the first stage programming. Thereafter, the string units SU0, SU2, SU4, and SU6 are selected for the word line WL0 to execute the second stage programming, and then the string units SU1, SU3, SU5, and SU7 are selected to execute the second stage programming. The same operations follow afterwards.

According to the order of the 1st Example, the pre-verify operation and the pre-program operation are executed in the first stage program, in a manner similar to the operations shown in FIG. 20 for the fourth embodiment.

6.2 2nd Example

FIG. 29 another writing order with respect to the string units SU0 to SU7 and the word lines WL0 to WL7 (i.e. another selection order thereof) according to 2nd Example.

According to the order of the 2nd Example, after the first and second stage programming for the even string units SUe are completed, the first and second stage programming for the odd string units SUo are executed.

In particular, in the 2nd Example, first, the string units SU0, SU2, SU4, and SU6 are selected for the word line WL0 to execute the first stage programming, and then the string units SU0, SU2, SU4, and SU6 are selected for the word line WL1 to execute the first stage programming. Next, the string units SU0, SU2, SU4, and SU6 are selected for the word line WL0 to execute the second stage programming, and then the string units SU0, SU2, SU4, and SU6 are selected for the word line WL2 to execute the first stage programming. When the second programming for the word line WL7 of the string unit SU6 is completed, the first and second stage programming for the odd string units SUo is initiated in the same manner.

In the writing order of the 2nd Example, the pre-verify operation and the pre-program operation in the first stage program are executed in a manner similar to the operations as illustrated in FIG. 20 for the fourth embodiment.

6.3 3rd Example

FIG. 30 is shows another writing order with respect to the string units SU0 to SU7 and the word lines WL0 to WL7 (i.e. another selection order thereof) according to 3rd Example.

According to the order of the 3rd Example, the first stage programming for the respective word lines WL0 and WL1 of the string unit SU0 is executed, and then the first stage programming for the respective word lines WL0 and WL1 of the string unit SU1 is executed. In a similar manner, the first stage programming for the word lines WL0 and WL1 of the string units SU2 to SU7 is executed in turn.

Thereafter, the second stage programming for the word line WL0 of the string unit SU0 is executed, and then the first stage programming for the word line WL2 of the string unit SU0 is executed. Next, the second stage programming for the word line WL0 of the string unit SU1 is executed, and then the first stage programming for the word line WL2 of the string unit SU1 is executed. The similar operations follow afterwards.

According to the order of the 3rd Example, the pre-verify operation and the pre-program operation in the first stage programming are executed in the same manner as the operations as shown in FIG. 13 for the first embodiment.

6.4 4th Example

FIG. 31 shows another writing order with respect to the string units SU0 to SU7 and the word lines WL0 to WL7 (i.e. another selection order thereof) according to 4th Example.

In the 4th Example, the writing order of the 3rd Example as shown in FIG. 30 is modified so that a higher priority is assigned to the even string units SUe than to the odd string units SUo when executing the program operation.

In particular, in the 4th Example, the first stage programming for the respective word lines WL0 and WL1 of the string unit SU0 is executed, and then the first stage programming for the respective word lines WL0 and WL1 of the string unit SU2 is executed. Thereafter, the first stage programming for the respective word lines WL0 and WL1 of each of the string units SU4 and SU6 is executed in the same manner.

Thereafter, the first stage programming for the respective word lines WL0 and WL1 of each of the odd string units SU1, SU3, SU5 and SU7 is executed in the same manner.

Then, the second stage programming for the word line WL0 of the string unit SU0 is executed, and the first stage programming for the word line WL2 of the string unit SU0 is executed. Thereafter, the second stage programming for the word line WL0 of the string unit SU2 is executed, and the first stage programming for the word line WL2 of the string unit SU2 is executed. The same operations are executed for the even string units SU4 and SU6, and then the same operations are executed on the respective word lines WL0 and WL2 of each of the odd string units SU1, SU3, SU5, and SU7. In the same manner, the programming is executed alternately for the even string units SUe and for the odd string units SUo.

According to the writing order of the 4th Example, the pre-verify operation and the pre-program operation are executed in the first stage programming, in the same manner as the operations as shown in FIG. 20 for the fourth embodiment.

6.5 5th Example

FIG. 32 shows another writing order with respect to the string units SU0 to SU7 and the word lines WL0 to WL7 (i.e. another selection order thereof) according to 5th Example.

According to the 5th Example, in the same manner as the 4th Example described with reference to FIG. 31, a higher priority is assigned to the even string units SUe than to the odd string units SUo when executing the programming.

In particular, in the 4th Example, the first stage programming for the respective word lines WL0 and WL1 of the string unit SU0 is executed, and then the first stage programming for the respective word lines WL0 and WL1 of the string unit SU2 is executed. Thereafter, the first stage programming for the respective word lines WL0 and WL1 of each of the string units SU4 and SU6 is executed in the same manner.

Thereafter, the second stage programming for the word line WL0 of the string unit SU0 is executed, and then the first stage programming for the word line WL2 of the string unit SU0 is executed. Next, the second stage programming for the word line WL0 of the string unit SU2 is executed, and then the first stage programming for the word line WL2 of the string unit SU2 is executed. Thereafter, similar operations are executed for each of the even string units SU4 and SU6, and then similar operations are executed for the respective word lines WL1 to WL7 of each of the even string units SU0, SU2, SU4, and SU6. After the first and second stage programming for the even string units SU0, SU2, SU4, and SU6 is completed, the first and second stage programming for the odd string units SU1, SU3, SU5 and SU7 is executed.

In the writing order according to the 5th Example, the pre-verify operation and the pre-program operation in the first stage programming are executed in a manner similar to the operations as shown in FIG. 20 for the fourth embodiment.

6.6 6th Example

FIG. 33 shows another writing order with respect to the string units SU0 to SU7 and the word lines WL0 to WL7 (i.e. another selection order thereof) according to 6th Example.

In this example, basically, after the first stage programming for the word line WLk (where k is a natural number between 2 and 7) of the string unit SU0 is executed, the second stage programming for the word line WL(k−1) of the same string unit SU0 is executed. The first and second stage programming in the above-mentioned order is repeated for each of the string units SU1 to SU7.

6.7 7th Example

FIG. 34 shows another writing order with respect to the string units SU0 to SU7 and the word lines WL0 to WL7 (i.e. another selection order thereof) according to 7th Example.

In the 7th Example, like the 6th Example described with reference to FIG. 33, after the first stage programming for the word line WLk (where k is a natural number between 2 and 7) of the string unit SU0 is executed, the second stage programming for the word line WL(k−1) of the same string unit SU0 is executed. The first and second stage programming in the above-described order is repeated for each of the even string units SU2, SU4, and SU6. Thereafter, the same operation is repeated for each of the odd string units SU1, SU3, SU5, and SU7.

6.8 8th Example

FIG. 35 shows another writing order with respect to the string units SU0 to SU7 and the word lines WL0 to WL7 (i.e. another selection order thereof) according to 8th Example.

In the example, in accordance with the rule defining the writing order of the 7th Example described with reference to FIG. 34, the first and second stage programming for each of the even string units SU0, SU2, SU4, and SU6 is executed. After the data writing is completed for all of the even string units SU0, SU2, SU4, and SU6, the first and second stage programming for each of the odd string units SU1, SU3, SU5, and SU7 is executed following the same rule.

6.9 Effects According to Sixth Embodiment

As discussed above, various writing orders may be adopted for the 2-stage programming.

7. Seventh Embodiment

A semiconductor memory device according to the seventh embodiment will be explained. Like the sixth embodiment, the seventh embodiment relates to the modification examples of the writing order according to the fifth embodiment. In particular, the seventh embodiment is applicable to the method of writing data according to the 2nd Example of the fifth embodiment as described above with reference to FIG. 24. The following explanation will focus only on differences of the seventh embodiment with respect to the fifth and sixth embodiments.

7.1 1st Example

FIG. 36 shows a writing order with respect to the string units SU0 to SU7 and the word lines WL0 to WL7 (i.e. a selection order thereof) according to 1st Example of the seventh embodiment.

For the word lines WL2 to WL7, the writing order according to this 1st Example is the same as the writing order shown in FIG. 33 for the sixth embodiment. In this 1st Example, the first stage programming for the word line WL0 is executed in the order of the string units SU0 to SU7. Thereafter, for each of the string units SU0 to SU7, the first stage programming is executed for the word line WL1, and the second stage programming is executed for the word line WL0. The rest of the operations are executed in the same way as the operations shown in FIG. 33.

7.2 2nd Example

FIG. 37 shows another writing order with respect to the string units SU0 to SU7 and the word lines WL0 to WL7 (i.e. another selection order thereof) according to 2nd Example of the seventh embodiment.

For the word lines WL2 to WL7, the writing order of this 2nd Example is the same as the writing order shown in FIG. 34 for the sixth embodiment. For the word lines WL0 and WL1, first, the first stage programming for the word lines WL0 of the even string units SU0, SU2, SU4 and SU6 is executed, and then the first stage programming for the word lines WL0 of the odd string units SU1, SU3, SU5 and SU7 is executed. Thereafter, for each of the even string units SU0, SU2, SU4, and SU6, the first stage programming for the word line WL1 is executed, and the second stage programming for the word line WL0 is executed. Then, the program operations for the odd string units SU1, SU3, SU5 and SU7 are similarly executed. The rest of the operations are the same as the operations as shown in FIG. 34.

7.3 3rd Example

FIG. 38 shows another writing order with respect to the string units SU0 to SU7 and the word lines WL0 to WL7 (i.e. another selection order thereof) according to 3rd Example of the seventh embodiment.

For the word lines WL2 to WL7, the writing order of this 3rd Example is the same as the writing order shown in FIG. 35 for the sixth embodiment. For the word lines WL0 and WL1, the first stage programming for the word line WL0 of the even string units SU0, SU2, SU4 and SU6 is executed. Then, for each of the even string units SU0, SU2, SU4, and SU6, the first stage programming for the word line WL1 is executed, and the second stage programming for the word line WL0 is executed. The operations for the odd string units SU1, SU3, SU5 and SU7 are similarly executed. Other operations are the same as the operations shown in FIG. 35.

7.4 Effects According to Seventh Embodiment

As discussed above, various writing orders can be adopted for the method of writing data according to Example 2. Furthermore, with the writing order according to the seventh embodiment, the second stage programming can be prioritized in comparison to the writing order as shown in FIG. 25 in which the first stage programming is executed simply in the order of the string units SU, and thereafter the second stage programming is executed. This reduces the length of the time during which the controller 200 holds the write data, thereby reducing the buffer memory capacity of the controller.

8. Other Modification Examples

As described above, the semiconductor memory device according to the above-described embodiments includes a first memory cell (e.g. SU0) capable of holding data, a second memory cell (e.g. SU1 or SU7) capable of holding data, a first word line coupled to the first memory cell, a second word line coupled to the second memory cell, and a first bit line capable of being electrically coupled to both the first memory cell and the second memory cell. The first memory cell shares a semiconductor layer with the second memory cell, and faces the second memory cell across the semiconductor layer. To write data into the first memory cell, the semiconductor memory device executes a first operation, a second operation, and a third operation. In the first operation, a first voltage (Vcut1) is applied to the second word line (pre-verifying). In the second operation, a second voltage (VPGM_L) higher than the first voltage is applied to the second word line after the first operation (pre-programming). In the third operation, after the second operation, a third voltage (VPGM) higher than the second voltage (VPGM_L) is applied to the first word line, and a fourth voltage (VPASS) lower than both the second voltage (VPGM_L) and the third voltage (VPGM) is applied to the second word line (data programming).

With the above-described embodiments, the reliability of writing data into the semiconductor memory device can be enhanced. The above-explained embodiments are presented by way of example, and various modifications may be applied. For example, according to the above-described embodiments, each memory cell transistor MT holds three-bit data. Instead, two-bit data or four-or-more-bit data may be held. Furthermore, various writing orders are introduced for the embodiments. However, the writing order is not limited to the above-described orders, and the order may be changed. In addition, a dummy transistor may be provided between the selection transistors ST1 and ST2 and the memory cell transistors MT in the NAND strings 50. The dummy transistor serves as a current path. Thus, when the corresponding string unit SU is selected, the dummy transistor is turned on. The order of the steps of the flowcharts may be changed.

Note that the semiconductor memory device according to each embodiment concerning the present invention may have the following configuration:

(1) When the memory cell holds 2-bit data ("Er", "A", "B", and "C"), the voltage applied to the selected word line in the reading operation of A level may range from, for example, 0V to 0.55V. However, the present embodiments are not limited to this, and the voltage may be set within any one of the ranges of 0.1V to 0.24V, 0.21V to 0.31V, 0.31V to 0.4V, 0.4V to 0.5V, and 0.5V to 0.55V.

The voltage applied to the selected word line in the reading operation of B level may range from, for example, 1.5V to 2.3V. However, the voltage is not limited to this and may be set within any one of the ranges of 1.65V to 1.8V, 1.8V to 1.95V, 1.95V to 2.1V, and 2.1V to 2.3V.

The voltage applied to the selected word line in the reading operation of C level may range from, for example, 3.0V to 4.0V. However, the voltage is not limited to this and may be set within any one of the ranges of 3.0V to 3.2V, 3.2V to 3.4V, 3.4V to 3.5V, 3.5V to 3.6V, and 3.6V to 4.0V.

A time (tR) of the reading operation may be set within the range of, for example, 25 to 38 μs, 38 to 70 μs, or 70 to 80 μs.

(2) A write operation may include a program operation and a verify operation. In the write operation, the voltage first applied to the selected word line in the program operation may range from, for example, 13.7V to 14.3V. The voltage is not limited to this, and may be set within any one of the ranges of, for example, 13.7V to 14.0V and 14.0V to 14.6V.

The voltage first applied to the selected word line when write-accessing an odd word line may be different from the voltage first applied to the selected word line when write-accessing an even word line.

If the program operation is ISPP (Incremental Step Pulse Program), the voltage of step-up may be, for example, 0.5V.

The voltage applied to a non-selected word line may be set within the range of, for example, 6.0V to 7.3V. However, the voltage is not limited to this, and may be set within the range of, for example, 7.3V to 8.4 or set to 6.0V or less.

The pass voltage to be applied may be changed depending on whether the non-selected word line is an odd word line or an even word line.

A time (tProg) of the write operation may be set within the range of, for example, 1,700 μs to 1,800 μs, 1,800 μs to 1,900 μs, or 1,900 μs to 2000 μs.

(3) In an erasing operation, the voltage first applied to the well, which may be formed in the upper portion of the semiconductor substrate and above which the memory cell may be arranged, may be set within the range of, for example, 12V to 13.6V. However, the voltage is not limited to this, and may be set within the range of, for example, 13.6V to 14.8V, 14.8V to 19.0V, 19.0V to 19.8V, or 19.8V to 21V.

A time (tErase) of the erasing operation may be set within the range of, for example, 3,000 μs to 4,000 μs, 4,000 μs to 5,000 μs, or 4,000 μs to 9,000 μs.

(4) In the structure of a memory cell, a charge accumulation layer may be arranged on a 4 to 10 nm thick tunnel insulation film. The charge accumulation layer may have a stacked structure of a 2 to 3-nanometer-thick insulation film of SiN or SiON and 3 to 8-nanometer-thick polysilicon. A metal such as Ru may be added to the polysilicon. An insulation film is provided on the charge accumulation layer. The insulation film may include a 4 to 10-nanometer-thick silicon oxide film sandwiched between a 3 to 10-nanometer-thick thick lower high-k film and a 3 to 10-nanometer-thick upper high-k film. As the high-k film, HfO or the like may be usable. The silicon oxide film may be thicker than the high-k film. A 30 to 70-nanometer-thick control electrode may be formed on a 3 to 10-nanometer-thick work function adjusting material on the insulation film. Here, the work function adjusting material may be a metal oxide film such as TaO or a metal nitride film such as TaN. As the control electrode, W or the like is usable.

An air gap may be formed between the memory cells.

In the above embodiments, a NAND flash memory has been exemplified as the semiconductor storage device. However, the embodiments may be applicable not only to the NAND flash memory but also to other general semiconductor memories, and also applicable to various kinds of storage devices other than the semiconductor memories. In the flowcharts described in the above embodiments, the order of processes may be changed as long as it is possible.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
   a first memory cell;
   a second memory cell;
   a first word line coupled to the first memory cell;
   a second word line coupled to the second memory cell; and
   a first bit line capable of being electrically coupled to both the first memory cell and the second memory cell,
   wherein the first memory cell faces the second memory cell with a semiconductor layer interposed therebetween,
   the device is configured to execute a first operation, a second operation, and a third operation to write data into the first memory cell, wherein
      in the first operation, a first voltage is applied to the second word line,
      in the second operation, after the first operation, a second voltage higher than the first voltage is applied to the second word line, and
      in the third operation, after the second operation, a third voltage higher than the second voltage is applied to the first word line, and a fourth voltage lower than both the second voltage and the third voltage is applied to the second word line.

2. The device according to claim 1, wherein the first voltage is applied to the second word line when data is read from the first memory cell, and
   the fourth voltage turns on a memory cell.

3. The device according to claim 1, wherein the first operation is executed to verify the second memory cell,
   the second operation includes a first program operation to increase a threshold value of the second memory cell based on a result of the first operation, and
   the third operation includes a second program operation to write data received from a controller configured to control the device, into the first memory cell.

4. The device according to claim 3, wherein the second program operation includes:
   a first write operation using a first program verify voltage; and
   a second write operation after the first write operation and using a second program verify voltage higher than the first program verify voltage, and
   wherein the first write operation in the third operation is executed with the first operation and the second operation, and
   the second write operation in the third operation is executed without the first operation and the second operation.

5. The device according to claim 3, wherein the second operation includes an operation of programming a memory cell which is determined in the first operation that a threshold value is lower than or equal to the first voltage.

6. The device according to claim 1, wherein the device is further configured to execute a fourth operation after the second operation,
   in the fourth operation, the first voltage is applied to the second word line, and
   the third operation is executed after the fourth operation.

7. The device according to claim 6, wherein the first operation is executed to verify the second memory cell,
   the second operation includes a first program operation to increase a threshold value of the second memory cell based on a result of the first operation,
   the fourth operation includes an operation to verify the second memory cell to confirm a result of the second operation, and
   the third operation includes a second program operation to write data received from a controller configured to control the device, into the first memory cell.

8. The device according to claim 3, wherein the second program operation includes:
   a first write operation using a first program verify voltage; and
   a second write operation executed after the first write operation and using a second program verify voltage higher than the first program verify voltage, and
   wherein the first write operation in the third operation is executed with the first operation and the second operation, and
   the second write operation in the third operation is executed without the first operation and the second operation.

9. The device according to claim 8, wherein the second operation includes an operation of programming a memory cell which is determined in the first operation that a threshold value is lower than or equal to the first voltage.

10. The device according to claim 1, wherein the device is further configured to execute a fourth operation before the first operation,
    in the fourth operation, the third voltage is applied to the second word line.

11. The device according to claim 10, wherein the fourth operation includes a third program operation to increase a threshold value of the second memory cell,
    the first operation includes an operation to verify the second memory cell,
    the second operation includes a first program operation to increase a threshold value of the second memory cell based on a result of the first operation, and
    the third operation includes a second program operation to write data received from a controller configured to control the device, into the first memory cell.

12. The device according to claim 11, wherein the second program operation includes:
    a first write operation using a first program verify voltage; and
    a second write operation after the first write operation and using a second program verify voltage higher than the first program verify voltage, and
    wherein the first write operation in the third operation is executed with the first operation and the second operation, and
    the second write operation in the third operation is executed without the first operation and the second operation.

13. The device according to claim 11, wherein the second operation includes an operation of programming a memory cell which is determined in the first operation that a threshold value is lower than or equal to the first voltage.

14. The device according to claim 1, wherein the first voltage is a negative voltage.

15. A semiconductor memory device comprising:
    a first memory cell;
    a second memory cell;
    a first word line coupled to the first memory cell;
    a second word line coupled to the second memory cell; and
    a first bit line capable of being electrically coupled to both the first memory cell and the second memory cell,
    wherein the first memory cell faces the second memory cell with a semiconductor layer interposed therebetween,
    wherein the device is configured to execute a first operation, a second operation, and a third operation, wherein
       in the first operation, a first voltage is applied to a word line corresponding to a non-selected memory cell,
       in the second operation, after the first operation, a second voltage higher than the first voltage is applied to the word line corresponding to the non-selected memory cell,
       in the third operation, after the second operation, a third voltage higher than the second voltage is applied to the word line corresponding to the non-selected memory cell, and a fourth voltage lower than both the third voltage and the second voltage is applied to a word line corresponding to a selected memory cell,
    the device is further configured to:
    execute the first operation, the second operation, and the third operations when receiving a write command for the first memory cell, and
    execute the third operation without the first and second operations executed during a period between the device entering to a busy state and returning to a ready state when receiving a write command for the second memory cell.

16. The device according to claim 15, wherein, the first voltage is applied to the second word line when data is read from the first memory cell,
    the fourth voltage turns on a memory cell, and
    the first voltage is a negative voltage.

17. The device according to claim 15, further comprising:
    a third memory cell; and
    a third word line coupled to the third memory cell,
    wherein the second word line is positioned between the first word line and the third word line, and
    the device is further configured to write data into the second memory cell after data is written into the first memory cell and the third memory cell.

18. The device according to claim 15, wherein the first operation is executed to verify the non-selected memory cell,
    the second operation includes a first program operation to increase a threshold value of the non-selected memory cell based on a result of the first operation, and
    the third operation includes a second program operation to write data received from a controller configured to control the device, into the selected memory cell.

19. The device according to claim 18, wherein the second program operation includes:
    a first write operation using a first program verify voltage; and
    a second write operation after the first write operation and using a second program verify voltage higher than the first program verify voltage, wherein the first write operation in the third operation is executed with the first operation and the second operation, and the second write operation in the third operation is executed without the first operation and the second operation.

20. The device according to claim 18, wherein the second operation includes an operation of programming a memory cell which is determined in the first operation that a threshold value is lower than or equal to the first voltage.

* * * * *